United States Patent
Tsukamoto et al.

(10) Patent No.: US 6,762,826 B2
(45) Date of Patent: Jul. 13, 2004

(54) SUBSTRATE ATTRACTING AND HOLDING SYSTEM FOR USE IN EXPOSURE APPARATUS

(75) Inventors: Izumi Tsukamoto, Tokyo (JP); Itaru Fujita, Utsunomiya (JP); Hideki Nogawa, Utsunomiya (JP); Yukio Takabayashi, Oomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/648,479

(22) Filed: Aug. 27, 2003

(65) Prior Publication Data

US 2004/0036850 A1 Feb. 26, 2004

Related U.S. Application Data

(62) Division of application No. 09/640,724, filed on Aug. 18, 2000.

(30) Foreign Application Priority Data

Aug. 19, 1999 (JP) .......................................... 11-232125
Aug. 20, 1999 (JP) .......................................... 11-233591
Jun. 19, 2000 (JP) ....................................... 2000-182463

(51) Int. Cl.[7] ........................ G03B 27/58; G03B 27/42; G03B 27/32; G01B 11/00

(52) U.S. Cl. .............................. 355/72; 355/53; 355/77; 356/399

(58) Field of Search ............................... 355/72, 73, 53, 355/55, 77; 356/399, 400, 401; 250/548

(56) References Cited

U.S. PATENT DOCUMENTS

| 5,923,408 | A | 7/1999 | Takabayashi | 355/53 |
| 6,137,562 | A | 10/2000 | Masuyuki et al. | 355/73 |
| 6,184,972 | B1 | 2/2001 | Mizutani et al. | 355/72 |
| 6,426,790 | B1 | 7/2002 | Hayashi | 355/72 |

FOREIGN PATENT DOCUMENTS

| JP | 2574818 | 10/1996 |
| JP | 2821678 | 9/1998 |

*Primary Examiner*—Peter B. Kim
(74) *Attorney, Agent, or Firm*—Fitzpatrick, Cella, Harper & Scinto

(57) ABSTRACT

A substrate attracting and holding system includes a holding table for holding a substrate, a protrusion provided on the holding table, the protrusion being disposed to be placed in a predetermined positional relationship with a position of an alignment mark to be used for processing the substrate or a position with respect to which an alignment mark is to be produced.

10 Claims, 21 Drawing Sheets

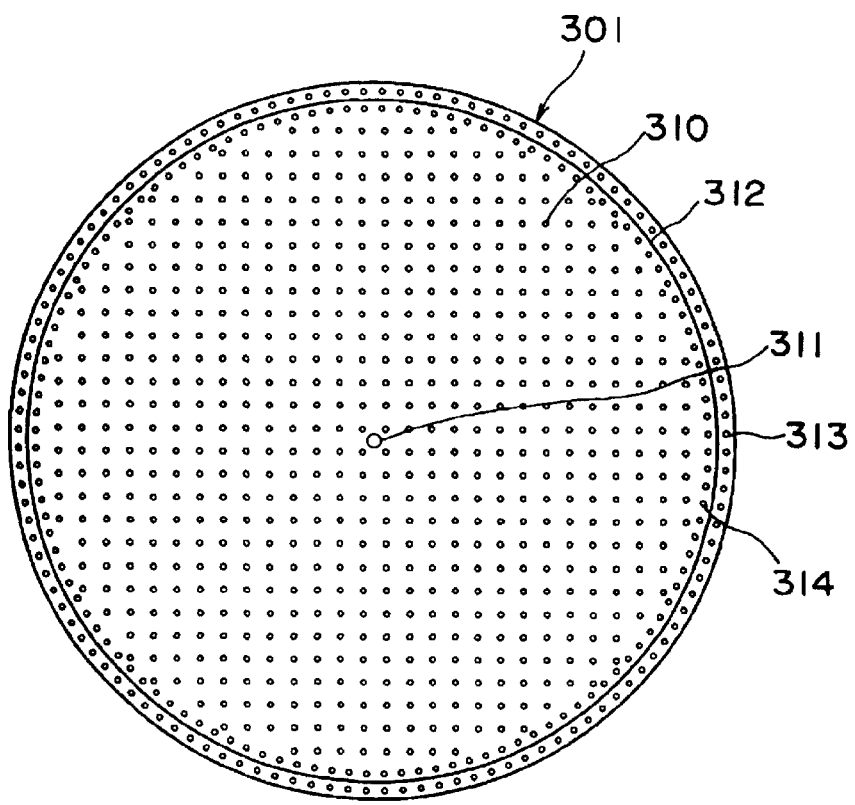
FIG. IIA
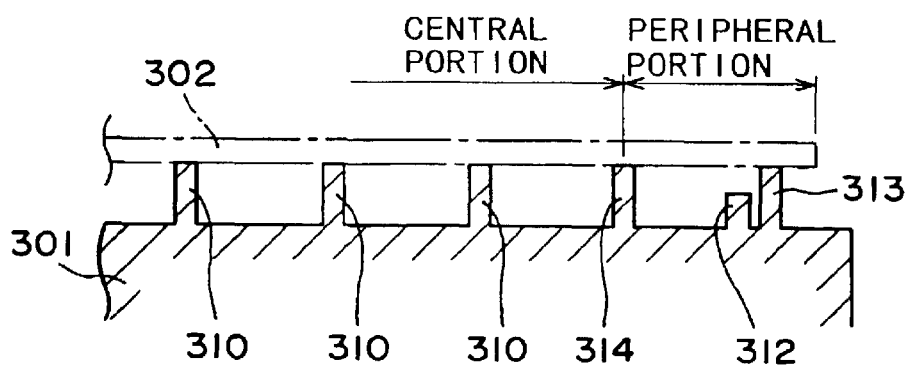
FIG. IIB

SUBSTRATE ATTRACTING AND HOLDING SYSTEM FOR USE IN EXPOSURE APPARATUS

FIELD OF THE INVENTION AND RELATED ART

This invention relates to a substrate attracting and holding system for grasping a substrate or workpiece and, more particularly, to a substrate attracting and holding system for use in a semiconductor manufacturing apparatus, a liquid crystal substrate manufacturing apparatus, a magnetic head manufacturing apparatus, a semiconductor inspection apparatus, a liquid crystal inspection apparatus, or a magnetic head inspection apparatus or for use in manufacture of a micro-machine, for example. In another aspect, the invention concerns an exposure apparatus or a device manufacturing method using such a substrate attracting and holding system.

In reduction projection exposure apparatuses used in the manufacture of semiconductor devices, for example, enlargement of the numerical aperture (NA) has been promoted to meet miniaturization of a device (chip). Although the resolution is improved by a larger numerical aperture, the effective depth of focus is shortened on the other hand. Thus, in order to maintain the resolution while keeping a sufficient practical depth, attempts have been made reduce the curvature of image field of a projection optical system or to improve the wafer flatness in regard to wafer thickness non-uniformness or flatness precision of a chuck.

One factor for causing degradation of the flatness of a wafer surface is the presence of a foreign particle caught between a chuck and a wafer. If a foreign particle of a few microns is once caught therebetween, the wafer at that portion is deformed and raised thereby. Where the effective depth of focus is 1 micron or less, local defocus occurs there and, in a worst case, a pattern defect is produced. In order to avoid degradation of the product yield rate due to such foreign particles, based on the probability, pin contact chucks (pin chucks) wherein the contact rate between a chuck and a wafer is reduced to a minimum are used prevalently.

As regards a machine for processing a substrate such as a semiconductor wafer, for semiconductor device manufacture, or a liquid crystal substrate, for liquid crystal display device manufacture, for example, a projection exposure apparatus, generally it uses a substrate attracting and holding system based on a vacuum attraction force to hold and secure a substrate (workpiece) and to correct any warp thereof to keep its flatness. FIG. 31 shows an example of such substrate attracting and holding system. In the substrate attracting and holding system (chuck) 201 illustrated, a substrate carrying plane is defined by a carrying table which comprises a plurality of pin contact type protrusions 202 disposed in a grid and a peripheral rim type protrusion 203 provided at the peripheral portion of the carrying plane for supporting the peripheral portion of a substrate. Also, there are suction holes 205 formed at the carrying plane where the contact type protrusions are provided, which holes are communicated with a vacuum piping system for reducing the pressure between the carrying plane and a substrate to be carried thereon.

The substrate attracting and holding system of a structure such as described above is used in a semiconductor exposure apparatus, for example. A wafer which is a substrate is conveyed onto the chuck 201 by means of a conveying system. After the wafer is placed on the chuck 201, it is held fixed on the chuck 201 by vacuum attraction applied through the attraction holes 205. Here, in order to reduce the probability of occurrence of deformation of the wafer surface due to catching a foreign particle between the chuck carrying table and the wafer, the total area of the substrate supporting protrusions distributed along the carrying plane is made small.

In the substrate attracting and holding system such as described above, the layout of the substrate supporting protrusions which provide the chuck carrying table is determined without any specific concern to the processing region on the substrate. It is set without any positional relationship with the substrate processing region. Namely, if the substrate processing region changes, the same chuck is used continuously. Therefore, if the surface of a substrate is deformed as a result of the attraction and holding of the substrate, the deformation may cause not only a deformation of that portion of the substrate in a vertical direction but also a distortion along the plane of the substrate. Further, the layout of the substrate supporting protrusions of the chuck is determined without any specific concern to the layout of alignment marks of a substrate. If the alignment mark layout of the substrate changes, the same chuck is used continuously. While a deformation of the substrate surface resulting from the attraction and holding of the substrate may cause an error in the coordinate of an alignment mark, since the relationship between each substrate alignment marks and each substrate supporting protrusions of the chuck is unknown, it is not possible to correct the coordinate error and, therefore, the registration precision is degraded.

On the other hand, in a lithographic process among semiconductor manufacturing processes in which a very fine pattern is transferred by exposure, in consideration of the depth of focus being decreased with miniaturization of the device or a coordinate error of a pattern to be transferred, the flatness of a substrate as held by a chuck has to be decreased as much as possible. If the substrate has a distortion along a horizontal direction caused by the deformation of the substrate surface, the error in the coordinate of an alignment mark of the substrate becomes large as a result of it. Additionally, if such coordinate error is different in each region (hereinafter, "shot") to be processed by a single operation or in each semiconductor device (hereinafter, "die"), since a semiconductor device is produced by superposing various patterns, the pattern registration is much degraded. If there is a large difference between shots, it can not be corrected easily and, in a worst case, a defect of a semiconductor device is produced.

It is known that, in a pin chuck, a wafer is deformed and warped between pins of the chuck due to vacuum attraction and that this causes degradation of the flatness of the wafer surface. Many proposals have been made to solve this problem. For example, Japanese Patent No. 2574818 proposes a structure wherein a ring-like groove is formed in an outer peripheral portion of a chuck and wherein pins are provided in a central portion, inside the groove, at a pin pitch of 2 mm or less, so as to keep good wafer flatness at the chuck peripheral portion and good wafer flatness within the pin pitch at the chuck central portion. In this patent, it is stated that, with a pin chuck having pins disposed in a grid, the flatness within the pin pitch can be approximated by a model of a beam having both ends free-supported and that, from a desired flatness, a required pin pitch can be made 2 mm or less. However, the approximation with the beam having both ends free-supported means that the pin pitch as a whole is determined by using the condition for the support with the free end at the outer peripheral portion which condition is worse than that at the central portion. There is no disclosure about determining optimum pin pitches for the flatness at the outer peripheral portion and at the central portion, respectively. Therefore, this causes an inconvenience that the pin pitch at the central portion becomes smaller than as required and, as a result, the contact rate becomes larger than as required.

In an attempt to solving this problem, Japanese Patent No. 2821678 proposes a structure wherein the pin pitch at a central portion of a chuck is made larger than that at an outer peripheral portion of the chuck, thereby to improve the wafer flatness at the chuck outer peripheral portion and the chuck central portion while keeping the contact rate small. According to this proposal, it is suggested that the flatness within the pin pitch at the peripheral portion can be approximated with a model of a beam having one end fixed and another end free-supported, while the flatness within the pin pitch at the central portion can be approximated with a model of a beam having both ends fixed, and that the ratio between the pin pitches at the peripheral portion and the central portion can be optimized.

In the proposal made in Japanese Patent No. 2821678, however, there is an assumption that the attraction force is even at the outer peripheral portion of the chuck and at the central portion of it. There is no disclosure about determining optimum attraction forces for the wafer flatness at the chuck outer peripheral portion and the chuck central portion, respectively. Also, there is no disclosure about determining an optimum relationship between the pin pitch and the attraction force, for the wafer flatness.

Although such wafer flatness, that is, degradation of the wafer surface flatness due to a warp produced within the pin pitch, is in fact a problem to be solved, there is a much more serious problem that a distortion (wafer distortion) is in practice produced due to the warp within the pin pitch. For example, where a wafer of a 200 mm diameter being currently widely used is placed on and attracted to a pin chuck having pins arrayed in a grid with a pin pitch 2 mm, there may occur a wafer distortion of about 1/2.6 of the wafer flatness. In a semiconductor process of 0.25 micron rule, being mass-produced currently, the tolerance for the wafer flatness is 80 nm if it is set to be 10% of a depth of focus 800 nm, whereas the tolerance for the wafer distortion is 5 nm if it is set to be 10% of an overlay precision 50 nm. This value when converted into a wafer flatness becomes equal to 13 nm which is much smaller than 80 nm. Namely, it is seen that, as compared with the flatness as required by the depth of focus, the flatness as required by the overlay precision is much more strict. Conventionally, the flatness correction has been made so as to reduce the wafer flatness to a tolerance, whereas it has never been done so as to reduce the wafer distortion to a tolerance. As a result, the wafer distortion may be more than the tolerance, causing a degraded overlay precision and a decreased yield rate. Alternatively, an additional process margin may be needed, which may obstruct further miniaturization of a semiconductor device or further enlargement of integration of it.

In the aforementioned Japanese Patent No. 2821678, it is stated that, when the flatness at the outer peripheral portion of a wafer is made better, a positional deviation of an alignment mark at the wafer peripheral portion can be reduced like a positional deviation of an alignment mark at the wafer central portion. However, there is no quantitative statement about the alignment mark positional deviation. Further, there is no recognition of the inconvenience of a wafer distortion resulting from a warp within the pin pitch at the chuck central portion. There is no disclosure about determining an optimum relationship between the pin pitch and the attraction force, in respect to the wafer distortion. There is no disclosure about determining the relationship with respect to each of the peripheral portion and the central portion, respectively. Namely, there is no disclosure of reducing the wafer distortion to a tolerance.

SUMMARY OF THE INVENTION

It is accordingly an object of the present invention to provide a substrate attracting and holding method, a substrate attracting and holding system, an exposure apparatus and/or a device manufacturing method using a substrate attracting and holding system, by which the influence, upon a substrate processing precision, of an error in coordinate of an alignment mark to be produced by deformation of the surface of the substrate resulting from the attraction and holding of the substrate.

In accordance with an aspect of the present invention, there is provided a substrate attracting and holding system, comprising: a holding table for holding a substrate; a protrusion provided on said holding table, said protrusion being disposed to be placed in a predetermined positional relationship with a position of an alignment mark to be used for processing the substrate or a position with respect to which an alignment mark is to be produced.

It is another object of the present invention to provide a substrate attracting and holding system, an exposure apparatus and/or a device manufacturing method using a substrate attracting and holding system, by which a distortion or degradation of a flatness of the surface of a substrate such as a wafer, for example, due to a deformation of the substrate surface to be produced when the substrate is attracted and held by using a plurality of protrusions, can be reduced so that the substrate can be attracted and held in an optimum state and that an overlay precision can be improved.

In accordance with another aspect of the present invention, there is provided a substrate attracting and holding system having a plurality of protrusions for supporting a substrate, for attracting and holding the substrate supported on the protrusions, characterized in that a disposition pitch L of the protrusions and an attraction force P of the substrate are set so as to satisfy a relation:

$$P \cdot L^3 \leq [36 \cdot E \cdot h^2 \cdot dxdy]/[\sqrt{3} \cdot k \cdot c]$$

where dxdy is a distortion tolerance, E is a longitudinal elasticity coefficient, h is a thickness of the substrate, c is a correction coefficient based on the protrusion disposition and k is a neutral plane correction coefficient.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A–1C are schematic views best showing features of a substrate attracting and holding method according to the present invention, wherein FIG. 1A is a plan view of an embodiment of a substrate attracting and holding system arranged in accordance with the substrate attracting and holding method of the present invention, FIG. 1B is a plan view of a substrate and it shows an example of disposition of shots or dies on a substrate, and FIG. 1C shows an example of patterns of alignment marks.

FIGS. 6A–6C are schematic views of a yet further embodiment of the present invention, wherein FIG. 6A is a plan view of a substrate attracting and holding system of this embodiment, FIG. 6B is a plan view of a substrate as attracted and held by the substrate attracting and holding system of this embodiment, and FIG. 6C is a view for explaining the relationship between substrate supporting protrusions of the substrate attracting and holding system of this embodiment and the position where alignment marks are produced.

FIGS. 7A–7C are schematic views of a still further embodiment of the present invention, wherein FIG. 7A is a plan view of a substrate attracting and holding system of this embodiment, FIG. 7B is a view for explaining the relationship between substrate supporting protrusions of the substrate attracting and holding system of this embodiment and the position where alignment marks are produced, and FIG. 7C is a fragmentary perspective view of a portion adjacent to the position where alignment marks are provided, in a state wherein a substrate is being attracted and held by the substrate attracting and holding system of this embodiment.

FIGS. 9A–9C are schematic views, respectively, wherein FIG. 9A shows a warp of a substrate as attracted and held by protrusions, FIG. 9B shows a model of a beam having both ends secured, bearing a uniformly distributed load, and FIG. 9C is a view for explaining the relation between the substrate surface and a neutral plane not deformed by a warp of the substrate.

FIGS. 11A and 11B show another embodiment of a substrate attracting and holding system according to the present invention, wherein FIG. 11A is a plan view and FIG. 11B is a sectional view of the same.

FIGS. 27A and 27B are graphs, respectively, wherein FIG. 27A shows flexure curves of a wafer within the pin pitch, and FIG. 27B shows the shape of a distribution of wafer distortion within the pin pitch.

DESCRIPTION OF THE PREFERRED EMBODIMENTS

Preferred embodiments of the present invention will now be described with reference to the accompanying drawings.

First Embodiment

Figure 1A:
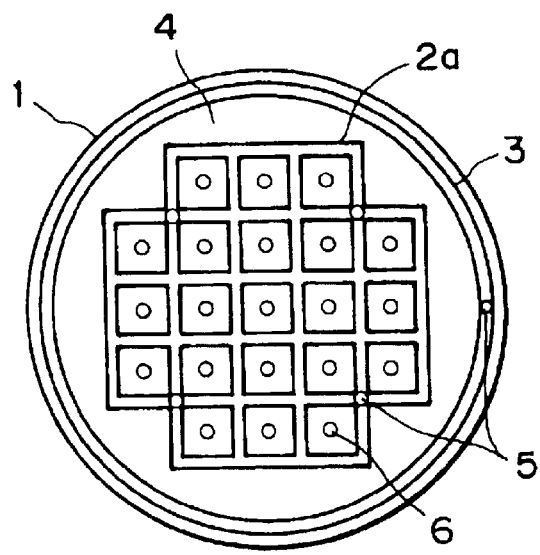
Figure 1B:
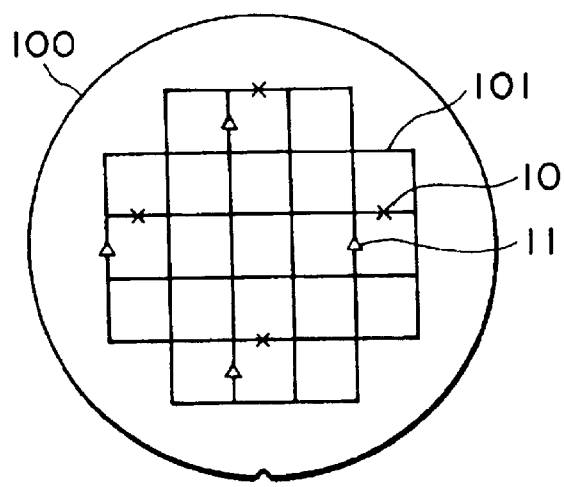
Figure 1C:
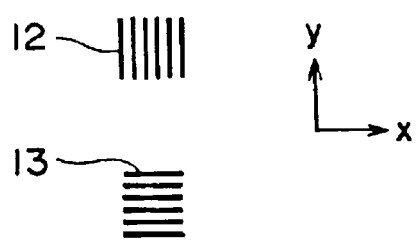

FIGS. 1A–1C best show features of a substrate attracting and holding method according to the present invention, wherein FIG. 1A is a plan view of an embodiment of a substrate attracting and holding system arranged in accordance with the substrate attracting and holding method of the present invention, FIG. 1B is a plan view of a substrate and it shows an example of disposition of shots or dies on a substrate, and FIG. 1C shows an example of patterns of alignment marks.

Denoted in FIG. 1A at 1 is a chuck which comprises a substrate attracting and holding system to be mounted on a chuck stage of a semiconductor exposure apparatus, for example. In FIG. 1B, denoted at 100 is a substrate such as a wafer to be attracted and held by the chuck 1. Denoted at 101 is a region (shot) of the substrate 100 which region is to be processed by a single operation. Alternatively, it denotes boundaries (scribe lines) for defining each semiconductor chip (die). As regards alignment marks of the substrate 100, alignment marks are already formed at positions as depicted by crosses 10 and triangles 11. Alternatively, alignment marks are going to be produced at these positions. At each position of the cross 10, there is an alignment mark 12 (FIG. 1C) which is a mark for position measurement with respect to X direction. At each position of the triangle 11, there is an alignment mark 13 which is a mark for position measurement with respect to Y direction. Here, an alignment mark may be an alignment mark having already been provided on a substrate, or it may be an alignment mark to be produced on the substrate for the subsequent process.

Figure 2:
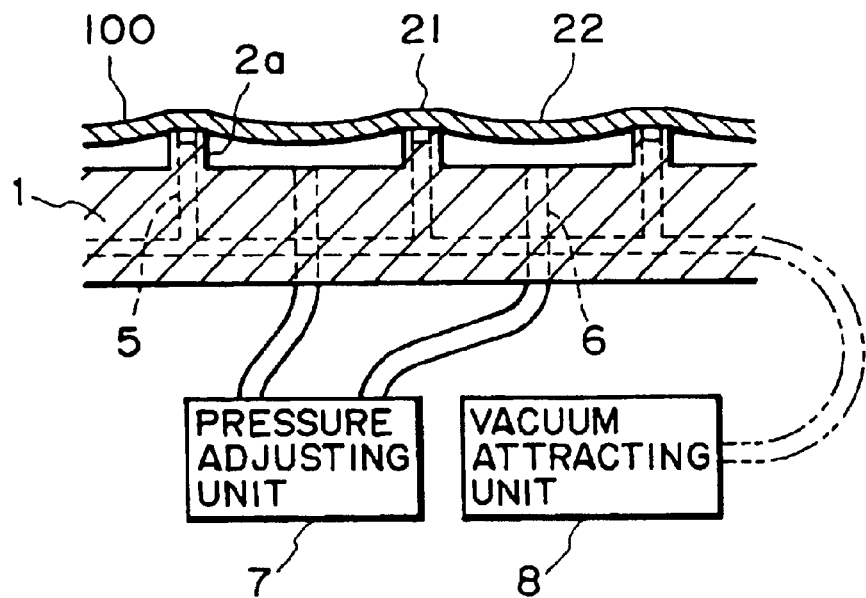
FIG. 2 is a schematic and sectional view of a substrate attracting and holding system in a state in which a substrate is being attracted and held thereby.

In the chuck 1 of FIG. 1A, there are protrusions 2 which provide a carrying table for carrying a substrate 100 thereon and which support the substrate thereon. The protrusions 2 include rim type protrusions 2a each comprising a rim-like protrusion having its top surface finished with a high flatness and a vacuum suction groove formed at the center of the width of the top thereof. In this embodiment, these protrusion are disposed along the scribe lines 101 of the shots on the substrate 100, and thus about the scribe lines 101. With the layout of the rim type protrusions 2a as described above, when the substate 100 is attracted and held by the chuck 1, alignment marks of the substrate can be constantly placed above the protrusions 2a. Denoted at 3 is a ring-like protrusion being provided at an outer peripheral portion of the chuck 1. It comprises a rim-like protrusion and a vacuum suction groove. Denoted at 4 is a region between the ring-like protrusion 3 and the protrusions 2a. In the region 4, substrate supporting protrusions and vacuum suction groove may be provided, as required. Denoted at 5 are suction holes which are communicated with a vacuum suction unit 8 (FIG. 2) for holding a substrate by attraction. These holes are formed to be communicated with suction grooves of the protrusions 2a and 3, respectively. Denoted at 6 are opening bores for adjusting a gas pressure in a space between the chuck 1 and the substrate 100 as attracted and held by the chuck 1. Each of these bores 6 is formed in a zone as divided by the protrusions 2a, that is, in a portion inside a shot of the substrate 100. As shown in FIG. 2, these bores 6 are communicated with a pressure adjusting unit 7. Further, the protrusions 2a and 3 of the carrying table for supporting the substrate 100 may preferably be arranged so that the total area contacting the substrate 100 is 10% or less of the area of the substrate surface.

With the structure of the chuck 1 described above, the substrate 100 when placed on the chuck 1 is attracted by suction through the suction holes 5 in response to the operation of the vacuum suction unit 8, whereby it is attracted to and held on the rim type protrusions 2a and 3. Then, by controlling the pressure adjusting unit 7, gas discharging or gas supplying is performed to the space between the chuck 1 and the substrate 100 being attracted and held by the chuck 1, whereby the pressure in that space can be adjusted.

Figure 3:
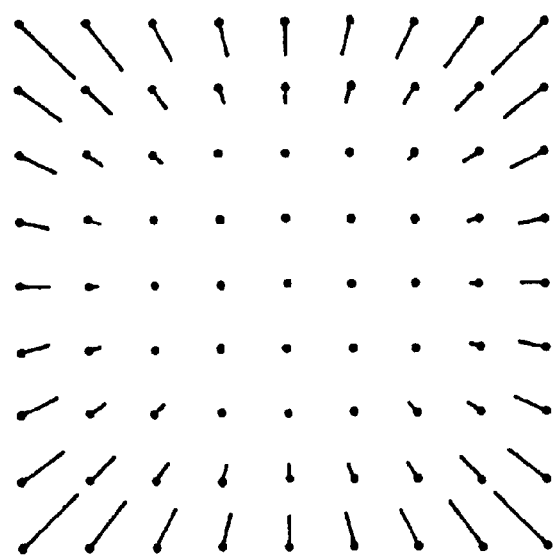
FIG. 3 is a schematic view for explaining an example of errors in coordinate, per a shot, to be produced as a result of attraction and holding of a substrate.

As described above, when the substrate 100 is held by vacuum attraction while being aligned with the chuck 1 as in this embodiment, the scribe line 101 portion of the substrate is attracted and secured by the vacuum suction grooves provided at the protrusions 2a, disposed along the scribe lines 101 of the shots of the substrate 100. As a result of it, as shown in FIG. 2, a flexure deformation is caused at the surface of the substrate 100. Such deformation of the substrate surface also causes distortion of the substrate along a horizontal plane. Namely, due to such horizontal distortion, in each shot there arise errors in coordinate as a result of deformation of the substrate surface, such as shown in FIG. 3, for example. In FIG. 3, each dot depicts a position inside a shot on the substrate, and the length of each line represents the magnitude of the coordinate error in the position at that dot. Since these coordinate errors in each shot are determined by the amount of inclination of the substrate surface, the coordinate error is small in a portion where the tilt of the substrate surface is small, near horizontal. In FIG. 2, at the scribe line 101 portion as denoted at 21 and at the central portion of a shot as denoted by 22, the coordinate error is small (in FIG. 3, the portion corresponding to the scribe line 101 portion at 21 is not illustrated). Therefore, if the alignment marks 12 and 13 of the substrate 100 are provided inside a shot (except the scribe line), then they are largely influenced by the coordinate errors such as shown in FIG. 3. In this embodiment, however, the alignment marks of the substate are disposed inside the scribe line 101. This portion of the substrate corresponds to the position shown at 21 in FIG. 2, and it is supported by the rim type protrusions 2a having a vacuum suction groove. As a result, the position where an alignment marks is present is held substantially horizontal and, therefore, the alignment mark can be kept substantially without being influenced by the coordinate error caused by the attraction and holding of the substrate.

Even in cases where the procedure for the substrate processing advances and changing the the alignment mark forming position becomes necessary, the same advantageous results are attainable by selection of any position, as long as it is inside the scribe line. Further, in this embodiment, the central portion of the shot corresponds to the position shown at 22 in FIG. 2, and it is the position not influenced by the coordinate error resulting from the deformation of the substrate surface by the substrate attraction. Therefore, an alignment mark can be formed there. Furthermore, by adjusting the gas pressure in the space between the chuck 1 and the substrate 100 through the function of the pressure adjusting unit 7, the region not influenced by the coordinate error as denoted at 22 in FIG. 2 can be extended. Thus, the region without being influenced by the coordinate error can be extended as required, such that the region for placement of alignment marks can be enlarged.

The alignment mark 12 shown in FIG. 1C is a mark for position detection with respect to X direction. The necessary condition for the location of the mark to avoid the influence of the coordinate error resulting from deformation of the substrate surface, is that the substrate surface has no inclination at least in X direction. Any inclination in Y direction does not affect the position detection in the X direction. Similarly, the alignment mark 13 shown in FIG. 1C is a mark for position detection with respect to Y direction. The necessary condition for the location of the mark to avoid the influence of the coordinate error resulting from deformation of the substrate surface, is that the substrate surface has no inclination at least in Y direction. Any inclination in X direction does not affect the position detection with respect to Y direction. In consideration of the above, in this embodiment, a mark for position detection in X direction may preferably be provided on a scribe line which is substantially parallel to the X direction, while a mark for position detection in Y direction may preferably be provided on a scribe line which is substantially parallel to Y direction.

As described above, the whole or a portion of the layout of protrusions of the carrying table which are distributed on the carrying surface of the chuck for carrying a substrate, is determined so that a particular positional relationship or a particular shape is defined thereby with respect to the positions of all the alignment marks of the substrate or to the positions where alignment marks are going to be produced. Thus, if, for example, the positions of all the alignment marks of the substrate or the positions where alignment marks are to be produced are set to be placed above the protrusions of the carrying table, then the alignment marks are not influenced by the deformation of the substrate surface, resulting from the attraction and holding of the substrate. Consequently, the coordinate error of the alignment mark resulting from the deformation of the substrate surface can be reduced and, thus, degradation of the substrate processing precision or of the registration precision can be prevented effectively.

Second Embodiment

Figure 4:
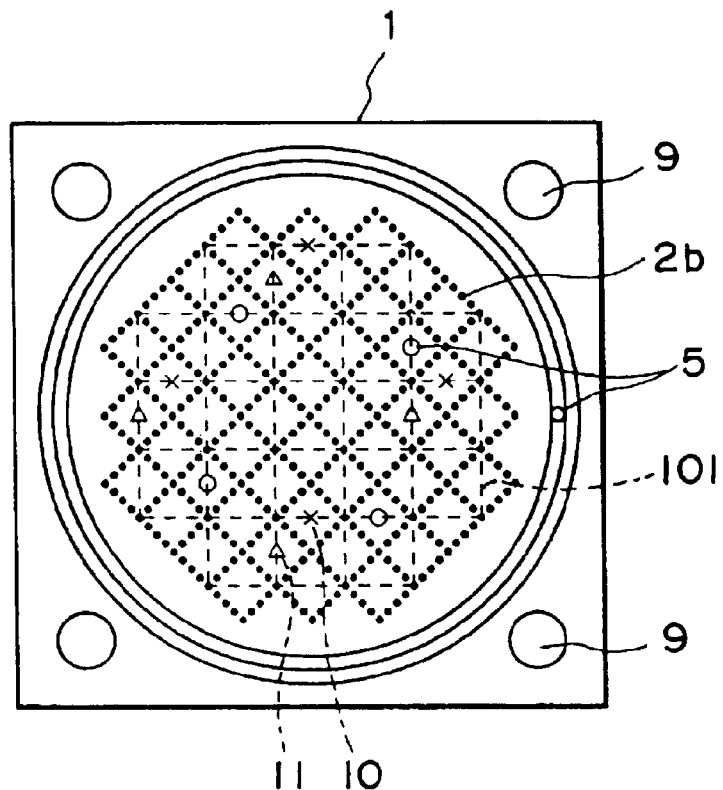
FIG. 4 is a plan view of another embodiment of a substrate attracting and holding system according to the present invention.

Referring now to FIG. 4, another embodiment of a substrate attracting and holding system of the present invention will be described.

In this embodiment, as regards the protrusions for supporting a substrate, the rim type protrusions 2a of the embodiment shown in FIG. 1A are replaced by pin contact type protrusions 2b and, additionally, the alignment mark forming positions 10 and 11 of the substrate 100 shown in FIG. 1B are placed at centers of the disposed protrusions 2b. In FIG. 4, scribe lines 101 of the substrate are depicted by broken lines, and crosses and triangles at 10 and 11 correspond to the alignment mark forming positions. Placing each alignment mark at the center of the disposed pin contact type protrusions 2b as illustrated is equivalent to providing an alignment mark at a position 22 in the sectional view of FIG. 2 where there is flexure of the substrate. At the central portion of the protrusion layout, the coordinate error is small as the central portion illustrated in FIG. 3.

Further, in this embodiment, the support for the processing region of the substrate is all provided by the pin contact type protrusions 2b and, therefore, the contact area between the chuck and the substrate can be made smaller than that in the preceding embodiment. This is effective to further reduce the influence of a foreign particle caught between the chuck 1 and a substrate held thereby.

Further, even when changing the alignment mark forming position becomes necessary with the advancement of the procedure of substrate processing, the same advantageous results are attainable in this embodiment by providing another alignment mark at the center of other protrusions 2b. Further, in this embodiment, the location of the substrate surface to be placed just above the pin contact type protrusions 2b is at the position corresponding to the position 21 in FIG. 2. It is the position not influenced by the coordinate error attributable to the deformation of the substrate surface caused by the holding of the substrate. Thus, an alignment mark can be provided there.

Further, in the embodiment of FIG. 4, there is alignment marks provided on the chuck 1, for bringing the chuck 1 and the substrate 100 into a particular positional relationship. More specifically, in a portion of the chuck 1 not to be covered by a substrate 100 as the same is attracted and held by the chuck, for example, at zones 9, plural sets of alignment marks such as at 12 and 13 in FIG. 1C may be provided. Like the preceding embodiment, the substrate 100 may be provided with alignment marks 12 (FIG. 1C) at positions of crosses 10, and alignment marks 13 (FIG. 1C) at positions of triangles 11. The positional relation between the chuck 1 and the substrate 100 held by the chuck 1 may be measured by using an alignment scope 108 (see FIG. 8) and a chuck stage 107 (FIG. 8) of an exposure apparatus, and the positional relation between them may be adjusted by using a driving mechanism (not shown). Thereafter, the substrate 100 may be held fixed. With this procedure, the alignment mark layout on the substrate and the protrusion layout of the chuck can be brought into a particular positional relationship such as, for example, placing each alignment mark of the substrate at the center of the layout of the pin contact type protrusions 2b of the chuck 1. The alignment marks may be those generally used for registration of a projected image of a reticle with a substrate. Since exposure apparatuses are usually equipped with the function of an alignment scope, advantageously there is no necessity of adding a special function to the exposure apparatus.

Third Embodiment

Figure 5:
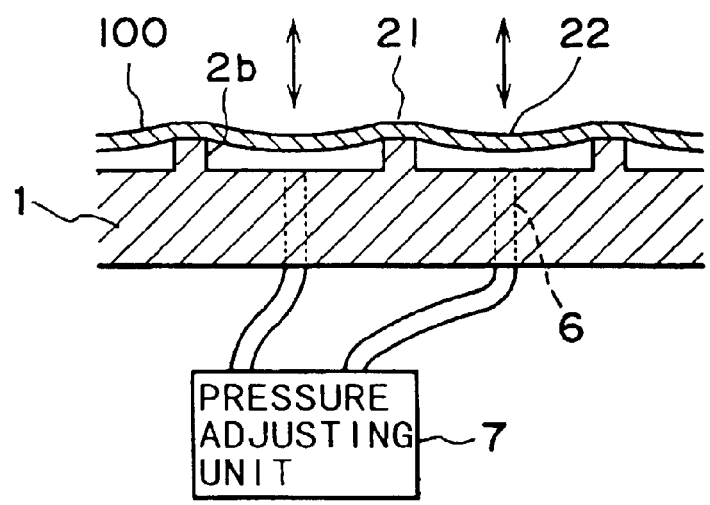
FIG. 5 is a schematic and sectional view of a substrate attracting and holding system according to a further embodiment of the present invention, in a state in which a substrate is being attracted and held thereby.

FIG. 5 shows a substrate attracting and holding system according to another embodiment of the present invention. This embodiment is an example wherein the protrusion for supporting a substrate is not provided with a vacuum suction groove. As regards the protrusion, this embodiment uses pin contact type protrusions 2b like those of the embodiment of FIG. 4. Further, the suction holes 5 communicated with a vacuum suction unit in the FIG. 4 embodiment are formed as opening bores 6 being communicated with a pressure adjusting unit 7. In this embodiment, with this pressure adjusting unit 7, the gas pressure in the space between the chuck 1 and the substrate 100 is adjusted at a negative pressure side, relative to the pressure at the top face of the substrate, whereby a substrate attracting function is provided also with this adjustment. Substantially the same advantageous results as of the embodiment of FIG. 2 are attainable with this structure. Further, in the embodiments of FIGS. 2 and 5, the structure may be modified so that different pressure adjustments are performed to the opening bores 6 opposed to the substrate 100. This meets substrates having a warp as a whole or a large local flexure, for example.

Fourth Embodiment

Figure 6A:
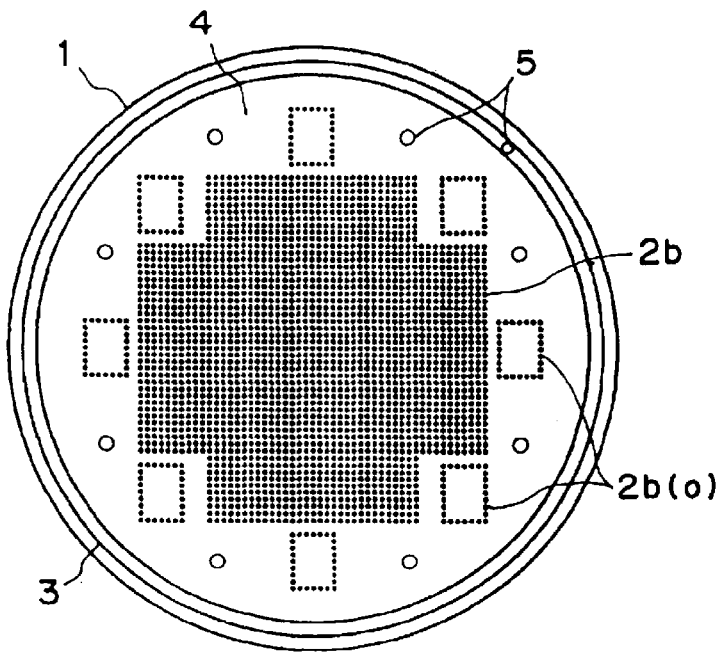
Figure 6B:
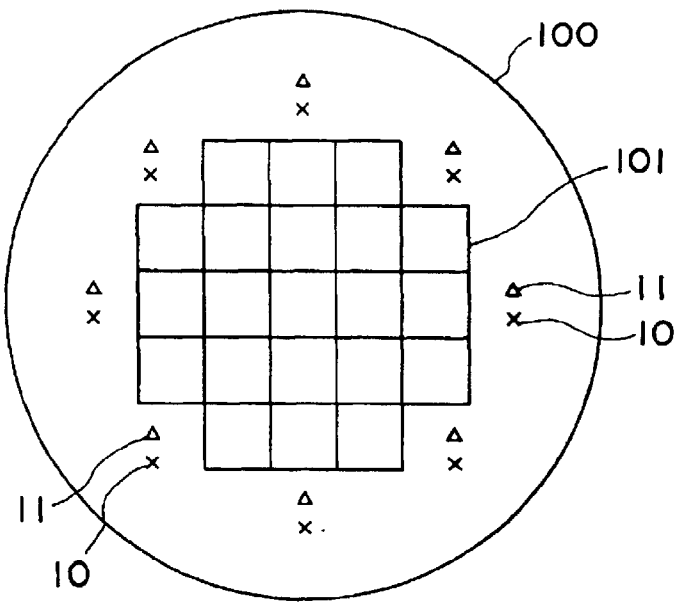
Figure 6C:
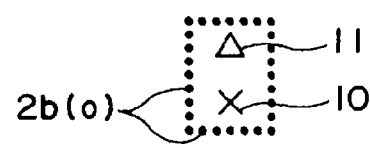

Referring to FIGS. 6A–6C, a substrate attracting and holding system according to another embodiment of the present invention will be described.

In the embodiments described above, the alignment mark forming position is placed inside the shot layout (an array of plural processing regions) such as upon a scribe line of a substrate or at a central portion of a shot on the substrate. This embodiment concerns an example wherein alignment marks of a substrate are provided outside the shot layout and wherein the coordinate error of the alignment mark can be reduced without being influenced by deformation such as a flexure of the substrate surface caused by the substrate holding and attraction.

FIG. 6A is a plan view of a chuck according to this embodiment, and FIG. 6B is a plan view of a substrate to be attracted and held by the chuck. FIG. 6C shows the relationship between substrate supporting protrusions of the chuck and alignment mark forming positions on the substrate.

In the substrate 100 to be attracted to and held by the chuck 1 of this embodiment, as shown in FIG. 6B, there are X-direction position measuring alignment marks 10 (depicted by crosses) and Y-direction position measuring alignment marks 11 (depicted by triangles) which are provided outside the shot layout (an array of plural processing regions as divided by scribe lines 101).

The chuck 1 of this embodiment has, as shown in FIG. 6A, substrate supporting protrusions of a carrying table which comprise a number of pin contact type protrusions 2b disposed in a grid-like array inside the region corresponding to the shot layout of the substrate, as well as a ring-like rim type protrusion 3 including a rim-like protrusion formed at an outer peripheral portion of the chuck 1 and a vacuum suction groove. Further, there are a number of pin contact type protrusions 2b(o) which are arrayed in an oblong shape at plural locations (eight locations in the drawing) inside a region 4 between the ring-like protrusion 3 at the outer peripheral portion and the pin contact type protrusions 2b (i.e., the region outside the shot layout of the substrate). Additionally, there are suction holes 5 being communicated with a vacuum suction unit for attraction of a substrate, which holes are provided in the vacuum suction groove of the rim type protrusion 3 and also in the region 4 between the ring-like protrusion 3 at the outer peripheral portion and the protrusions 2b. The pin contact type protrusions 2b(o) arrayed in an oblong shape are disposed to surround the alignment mark forming positions 10 and 11 on the substrate 100, as illustrated. Additionally, these protrusions are placed in such positional relationship that the alignment mark forming positions 10 and 11 of the substrate is set at a location where there occurs no coordinate error as a result of deformation of the surface of the substrate as the same is attracted, for example, at a position equivalent to the position 22 shown in FIG. 2, not being influenced by the coordinate error. Also, the pin contact type protrusions 2b arrayed in a grid are disposed with a spacing (pitch) corresponding to $\frac{1}{10}$ of the spacing (pitch) of the shots on the substrate 100.

With the structure of this embodiment as described above, even in a case where alignment marks of the substrate are formed outside the shot layout, when the substrate 100 is attracted and held by the chuck 1, the portion surrounding the alignment mark forming positions 10 and 11 of the substrate is supported by the pin contact type protrusions 2b(o) arrayed in an oblong shape. Further, the alignment mark forming positions 10 and 11 are placed in such positional relationship with the pin contact type protrusions 2b(o) of oblong shape array that they are located at a place where no coordinate error occurs. Therefore, the influence of deformation of the substrate surface such as warp caused by attraction and holding of the substrate can be avoided. The coordinate error of the alignment mark can be reduced, and degradation of the substrate processing precision or registration precision can be prevented.

As long as the alignment mark forming position on the substrate is placed at a location equivalent to the position 22 in FIG. 2 relatively to the substrate supporting protrusions as the substrate is attracted and held thereby, the substrate supporting protrusions are not limited to the pin contact type protrusion and they may be provided by a rim type protrusion or protrusions. Further, the shape of the array of the substrate supporting protrusions surrounding the alignment mark forming position is not limited to an oblong shape. It may have a triangular shape, a polygonal shape or an elliptical shape. Further, a substrate supporting protrusion may be provided at a portion corresponding to the alignment mark forming position outside the shot layout of the substrate, so that the alignment mark forming position of the substrate is supported by this supporting protrusion. This enables that the alignment mark forming position is supported substantially horizontally, like the position 21 shown in FIG. 2, thereby to remove the coordinate error of the alignment mark. In that occasion, similarly, degradation of the substrate processing precision and registration precision can be prevented.

Fifth Embodiment

Figure 7A:
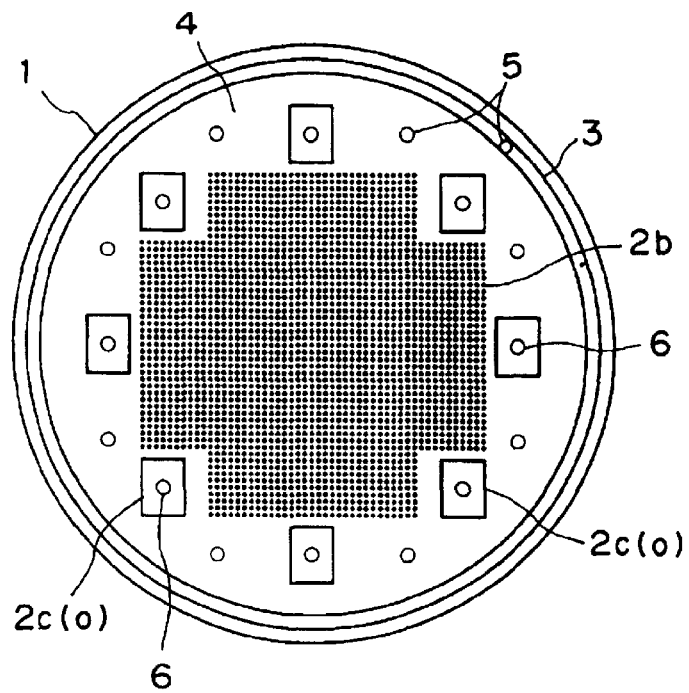
Figure 7B:
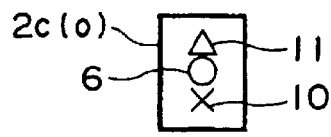
Figure 7C:
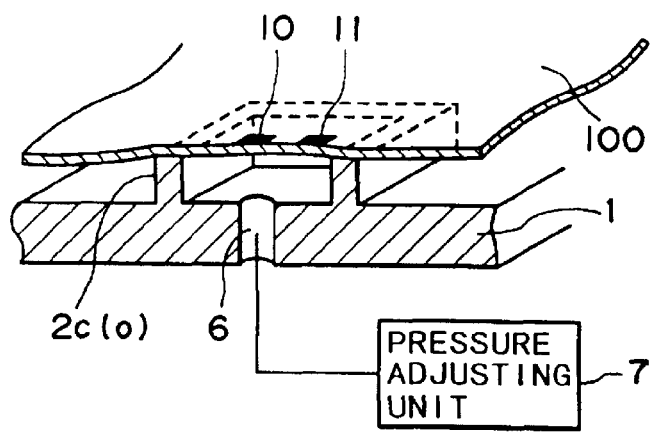

Referring to FIGS. 7A–7C, a substrate attracting and holding system according to another embodiment of the present invention will be described.

This embodiment is a modified form of the embodiment shown in FIGS. 6A–6C. Like the preceding embodiment, when alignment marks of a substrate are formed outside the shot layout, this embodiment enables reduction of a coordinate error of the alignment mark without being influenced by deformation of the substrate surface such as flexure caused by attraction and holding of the substrate.

FIG. 7A is a plan view of a chuck of this embodiment, and FIG. 7B shows the relationship between substrate supporting protrusions of the chuck and alignment mark forming positions on a substrate. FIG. 7C is a fragmentary perspective view in which a portion around an alignment mark forming position of a substrate as the same is attracted and held on the chuck is illustrated in a section.

The substrate 100 to be attracted and held by the chuck 1 of this embodiment is similar to that shown in FIG. 6B, and there are alignment mark forming positions 10 (depicted by crosses) and alignment mark forming positions 11 (depicted by triangles) which are disposed outside the shot layout. The chuck 1 of this embodiment has, as shown in FIG. 7A, substrate supporting protrusions of a carrying table which comprise a number of pin contact type protrusions 2b disposed in a grid-like array inside the region corresponding to the shot layout of the substrate, as well as a ring-like rim type protrusion 3 including a rim-like protrusion formed at an outer peripheral portion of the chuck 1 and a vacuum suction groove. Further, there are a number of pin contact type protrusions 2c(o) which are arrayed in an oblong shape at plural locations (eight locations in the drawing) inside a region 4 between the ring-like protrusion 3 at the outer peripheral portion and the pin contact type protrusions 2b (i.e., the region outside the shot layout of the substrate). Additionally, there are suction holes 5 being communicated with a vacuum suction unit for attraction of a substrate, which holes are provided in the vacuum suction groove of the rim type protrusion 3 and also in the region 4 between the ring-like protrusion 3 at the outer peripheral portion and the protrusions 2b. Also, there are opening bores 6 in the zones as defined by the rim-like protrusions 2c(o) disposed in an oblong shape, which bores are communicated with a pressure adjusting unit 7 (FIG. 7C). This pressure adjusting unit 7 serves to perform gas discharging or gas suction to the space between the chuck 1 and the substrate 100 as the substrate is held by the chuck, to thereby adjust the gas pressure in that space. The pin contact type protrusions 2c(o) arrayed in an oblong shape are disposed to surround a portion corresponding to the alignment mark forming positions 10 and 11 on the substrate 100, like the embodiment of FIGS. 6A–6C. Additionally, these protrusions are placed in such positional relationship that the alignment mark forming positions 10 and 11 of the substrate are set at a location where there occurs no coordinate error as a result of deformation of the surface of the substrate as the same is attracted, for example, at a position equivalent to the position 22 shown in FIG. 2, not being influenced by the coordinate error.

With the structure of this embodiment as described above, in addition to the advantageous effects as attainable with the embodiment of FIGS. 6A–6C, the gas pressure inside the space between the chuck 1 and the substrate 100 at the zone as separated by the rim-like protrusions 2c(o) can be adjusted by gas discharging or gas suction made to that space by means of the pressure adjusting unit 7. This enables adjustment of the amount of flexure of the substrate 100 in that region, as the same is supported by the rim-like protrusions 2c(o) when the substrate is attracted and held. Thus, it enables appropriate adjustment of the surface deformation of the substrate 100 at the alignment mark forming positions or of a portion around them, thereby to perform flatness correction of the substrate surface. This extends the region of the substrate surface not influenced by the deformation such as flexure, for example, to be caused by attraction and holding of the substrate, and thus enlargement of the region where an alignment mark can be formed.

In accordance with this embodiment, as described, the alignment mark forming positions 10 and 11 of the substrate are not influenced by deformation such as flexure of the substrate surface due to the attraction and holding of the substrate, such that the coordinate error of the alignment mark can be avoided positively. Further, the substrate in the zone as divided by the rim-like protrusions 2c(o) can be held substantially horizontally and, therefore, the range for forming an alignment mark can be enlarged. Thus, also with this embodiment, degradation of the substrate processing precision or registration precision can be prevented.

In the embodiments as described above, the position of an alignment mark or the position where an alignment mark is to be formed and a protrusion layout adjacent to that position are placed in a particular positional relationship with each other. More specifically, the positions of alignment marks of the substrate or the positions where alignment marks are going to be produced are set at such location less influenced by deformation of the substrate surface resulting from the attraction and holding of the substrate. This effectively reduces the coordinate error of the alignment mark resulting from the deformation of the substrate surface.

As regards the alignment mark position or the alignment mark forming position, when the position of an alignment mark of a substrate or the position where an alignment mark is to be produced and the layout of substrate supporting protrusions adjacent to it is placed in a particular positional relationship, it is possible to predict deformation of the substrate surface due to the attraction and holding of the substrate. Therefore, it is possible to predict and estimate the coordinate error of the alignment mark to be caused by the deformation of the substrate surface. Thus, when the alignment mark is measured, correction may be made to the measurement result to correct the coordinate error of the alignment mark due to deformation of the substrate, as calculated beforehand. This accomplished further reduction of the adverse influence.

Figure 8:
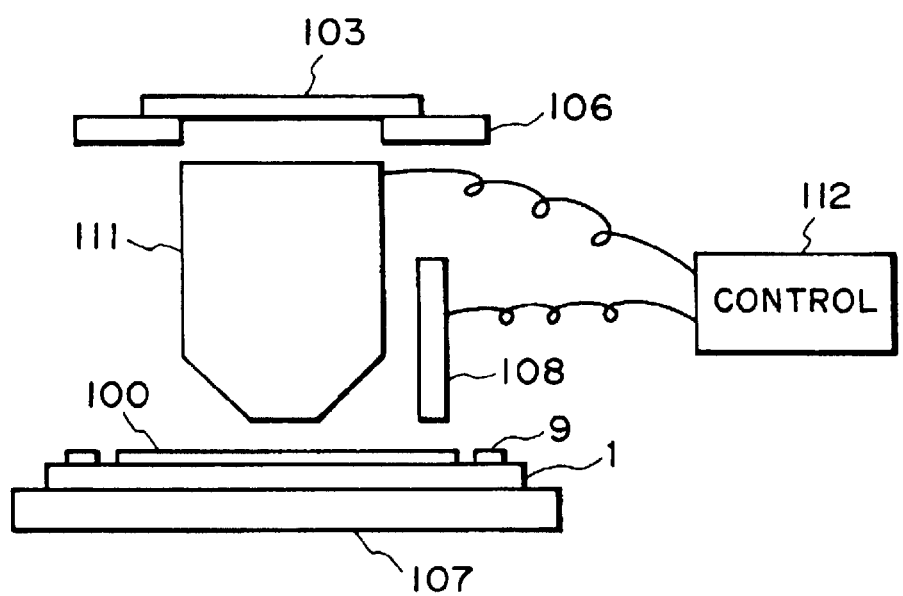
FIG. 8 is a schematic view of the structure of an exposure apparatus.

Even if the alignment mark position or the alignment mark forming position can not be set exactly at the location as described in the preceding embodiments, an exposure apparatus such as shown in FIG. 8, for example, may be used to calculate the coordinate error of the alignment mark on the basis of the combination of the disposition of the alignment mark on the substrate or the alignment mark forming position and the disposition of the protrusions of the chuck. By taking the result of calculation into account for the result of detection of the alignment mark through an alignment scope, magnification adjustment or distortion adjustment of a projection optical system may be made. This enables optimum superposition of a projected image of a reticle with a pattern on the substrate.

The calculation of the coordinate error may be made by using a function for calculation of the coordinate error, or alternatively it may be made by using a table prepared in accordance with the positional relation between the alignment mark position or alignment mark forming position and the protrusions adjacent to it.

Sixth Embodiment

Referring to FIG. 8, an exposure apparatus will be described.

Denoted in FIG. 8 at 103 is a reticle or mask (hereinafter, "reticle") which is an original having formed thereon a pattern to be transferred by exposure to a substrate 100 such as a wafer, for example. The reticle 103 is held by a reticle stage 106. Denoted at 107 is a chuck stage which is movable along a horizontal plane (X-Y plane) while carrying a chuck 1 thereon. Denoted at 108 is an alignment scope for measuring the positional relationship between the exposure apparatus and the substrate or between the substrate and the chuck. Denoted at 111 is a projection optical system having a function for adjusting magnification or distortion of a projection lens. Denoted at 112 is a control unit for calculating or calibrating a coordinate error of an alignment mark due to distortion of the substrate surface, with respect to the result of detection of the alignment mark, and for specifying the adjustment of the projection optical system 111.

Exposure light passing through the reticle 103 is reduced in scale by the projection optical system 111, and it is projected on a substrate 100 being attracted and held by the chuck 1. The substrate 100 is coated beforehand with a small thickness resist material which is a photosensitive material adapted to effectively cause a chemical reaction in response to irradiation with the exposure light. It functions as an etching mask in a subsequent process.

With the structure of the exposure apparatus as described above, an error in the coordinate of an alignment mark to be produced by deformation of the substrate surface attributable to the attraction and holding of the substrate can be calculated once the combination of the alignment mark forming position inside the substrate and the disposition of the protrusions of the chuck is determined. Therefore, even if the alignment mark position can not be set exactly at the location as described with reference to the preceding embodiments, the coordinate error of the alignment mark can be calculated by the control unit 12 on the basis of the combination of the alignment mark disposition on the substrate and the disposition of the substrate supporting protrusions of the chuck. By taking the result of calculation into account in respect to the result of detection of the alignment mark through the alignment scope 108, the magnification or distortion of the projection optical system 111 can be adjusted to assure optimum superposition of a projected image of the reticle 103 with the pattern of the substrate 100.

Figure 9A:
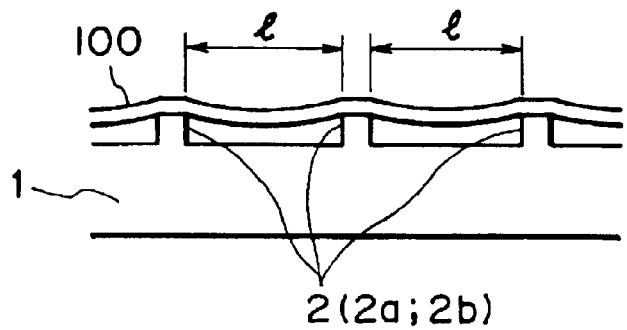
Figure 9B:
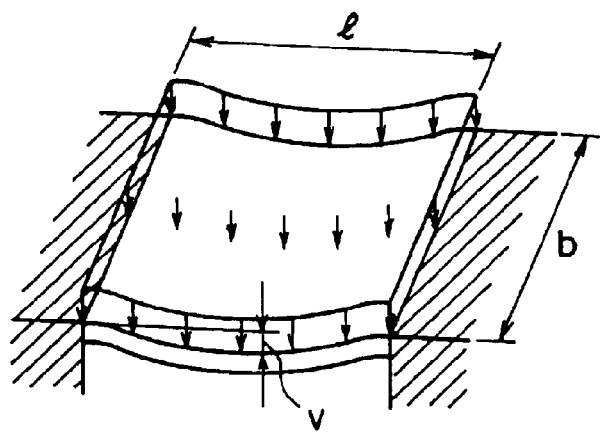
Figure 9C:
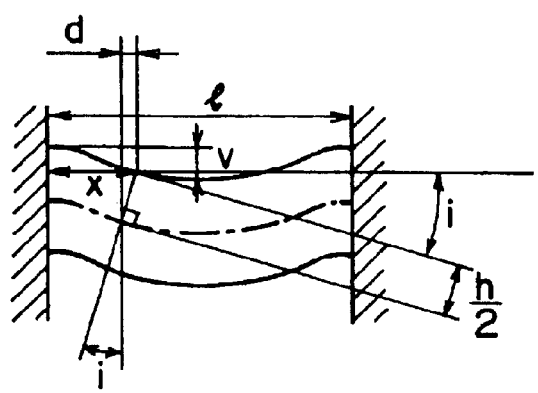

A tolerance of alignment for an alignment mark of a substrate with the disposition of protrusions of a chuck for supporting the substrate can be estimated by approximation using a model such as follows. FIG. 9A shows flexure of a substrate as attracted to and held by protrusions. FIG. 9B shows a model of a beam having both ends fixed, which receives an even distributed load. FIG. 9C is a view for explaining the relation between the substrate surface and a neutral plane not deformed by the flexure of the substrate.

Where the spacing between protrusions 2 for supporting the substrate is 1, the flexure of the substrate is such as shown in FIG. 9A. In this case, as regards a material dynamic model, a model of a beam having both ends fixed and receiving an even distributed load such as shown in FIG. 9B applies. According to "Mechanical Engineering Handbook", edited by Japanese Mechanical Engineering Association, Maruzen Co., if a load per a unit length as determined by a vacuum pressure p or the like is w, a sectional secondary moment is I, the spacing between the protrusions is 1, and a longitudinal elasticity coefficient is E, then the flexure v of the substrate at a position x with respect to a direction from a protrusion end as an origin to a juxtaposed protrusion as well as the inclination i of the substrate are expressed as follows:

$$v=(w1^4/24EI)[x^2/1^2-2x^3/1^3+x^4/1^4] \quad (1.1)$$

$$i=(w1^3/12EI)[x/1-3x^2/1^2+2x^3/1^3] \quad (1.2)$$

Here, when a thickness h of the substrate and a width b thereof shown in FIG. 9B are used, it follows that there are relations such as follows:

$$I=bh^3/12 \quad (1.3)$$

$$w=pb \quad (1.4)$$

In FIG. 9C, a dash-and-dot line passing about the center of the thickness h depicts a neutral plane which is not elongated or contracted in X direction, at any x position thereof. With respect to this neutral plane, depending on the location there occurs an elongation/contraction in X direction of the substrate surface. Since the distance from the neutral plane to the substrate surface is influenced by the processing state of the substrate or the attraction state thereof, taking k as a neutral plane correction coefficient, the coordinate error d of the substrate surface can be expressed as follows:

$$d=k(hi/2)=k(hw1^3/24EI)[x/1-3x^2/1^2+2x^3/1^3] \quad (1.5)$$

From this, it follows that:

$$d=f(x)=k(p1^3/2h^2E)[x/1-3x^2/1^2+2x^3/1^3] \quad (1.6)$$

The tolerance for the alignment error (i.e., the difference between the value x in an idealistic state and the value $x_a$ being shifted practically) between the disposition of the alignment mark of the substrate and the disposition of the protrusion of the chuck, if a tolerance for the coordinate error not adversely influential to the alignment is set, can be detected from equation (1.6) above, since the values p, h, E and I are known as determined by the apparatus or the substrate to be used in practice. If the tolerance for the coordinate error is denoted by $d_c$, then the alignment error tolerance $x_c$ can be determined to satisfy equation (1.7) below:

$$d_c \geq f(x_c)-f(x_0) \quad (1.7)$$

Practically, while the two-dimensional disposition of the protrusions is taken into account, equation (1.6) as the same is advanced may be used, with a result of a higher accuracy.

Figure 10:
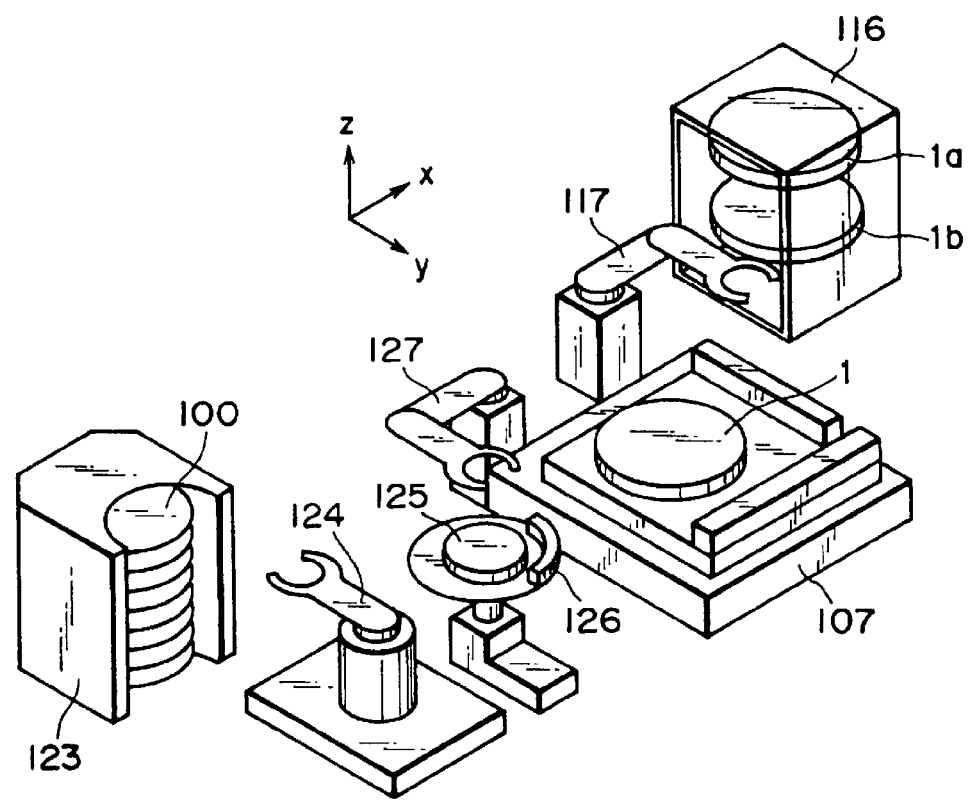
FIG. 10 is a schematic view of the structure of a mechanism for replacement of substrates and chucks.

Referring to FIG. 10, a mechanism for changing substrates and chucks in accordance with the present invention will now be described.

In the present invention, when the disposition of the alignment mark of the substrate is changed and, as a result, the predetermined positional relation with the disposition of the protrusions of the chuck is changed, the chuck has to be replaced by another. FIG. 10 shows a mechanism for changing chucks without decreasing the throughput.

In FIG. 10, denoted at 116 is a chuck cassette for accommodating therein plural chucks 1a, 1b, . . . , each having protrusions disposed in accordance with the processing shape for substrates. Denoted at 117 is a conveyance robot for unloading a desired chuck from the chuck cassette 116 and for conveying the same onto a chuck stage 107 on which an exposure process or the like is to be performed. Denoted at 123 is a substrate cassette for accommodating therein plural substrates to be processed. Denoted at 124 is another conveyance robot for unloading each substrate 100 from the substrate cassette 123 and for conveying the same onto a prealignment stage 125. Denoted at 127 is a conveyance robot for moving a substrate, having been prealigned by the prealignment stage 125 onto the chuck 1 already mounted on the X-Y stage 107.

With the structure of the mechanism described above, a substrate 100 to be processed is taken out of the substrate cassette 123 by the conveyance robot 124. Generally, it is placed on the prealignment stage 125 having an outer peripheral shape detecting sensor 126 for the substrate, and a rough alignment operation of the same with respect to a projected image in an exposure apparatus is performed there. During this prealignment operation, the chuck is replaced by a necessary chuck 1 by means of the chuck conveyance robot 117 and between the chuck stage 107 and the chuck cassette 116. This enables use of a chuck suited to the substrate, without a large decrease of the throughput.

It is to be noted here that the substrate attracting and holding method and the substrate attracting and holding system of the present invention are not limited to use in an exposure apparatus. They may of course be used in a liquid crystal substrate manufacturing apparatus, a magnetic head manufacturing apparatus, various inspection machines for a semiconductor, or the manufacture of micro-machines, for example.

In accordance with the present invention as described hereinbefore, the position of an alignment mark of a substrate or the position where an alignment mark is going to be formed can be set at a specific location in relation to flexure of a substrate to be attracted and held, to thereby avoid an adverse influence of a coordinate error of the alignment error due to flexure of the substrate surface. Further, the coordinate error of the alignment mark can be calculated beforehand from the positional relationship between the alignment mark and the disposition of an protrusion for supporting the substrate adjacent there. On the basis of the result of calculation, the coordinate error of the alignment mark can be corrected.

Thus, in an exposure apparatus, degradation of the pattern overlay precision due to the influence of surface flexure, for example, of the substrate caused by the attraction and holding of the same, can be avoided, and production of a defect of a semiconductor device resulting from the shape of the substrate surface can be prevented.

Seventh Embodiment

Next, a substrate attracting and holding system according to another embodiment of the present invention will be described.

Figure 12:
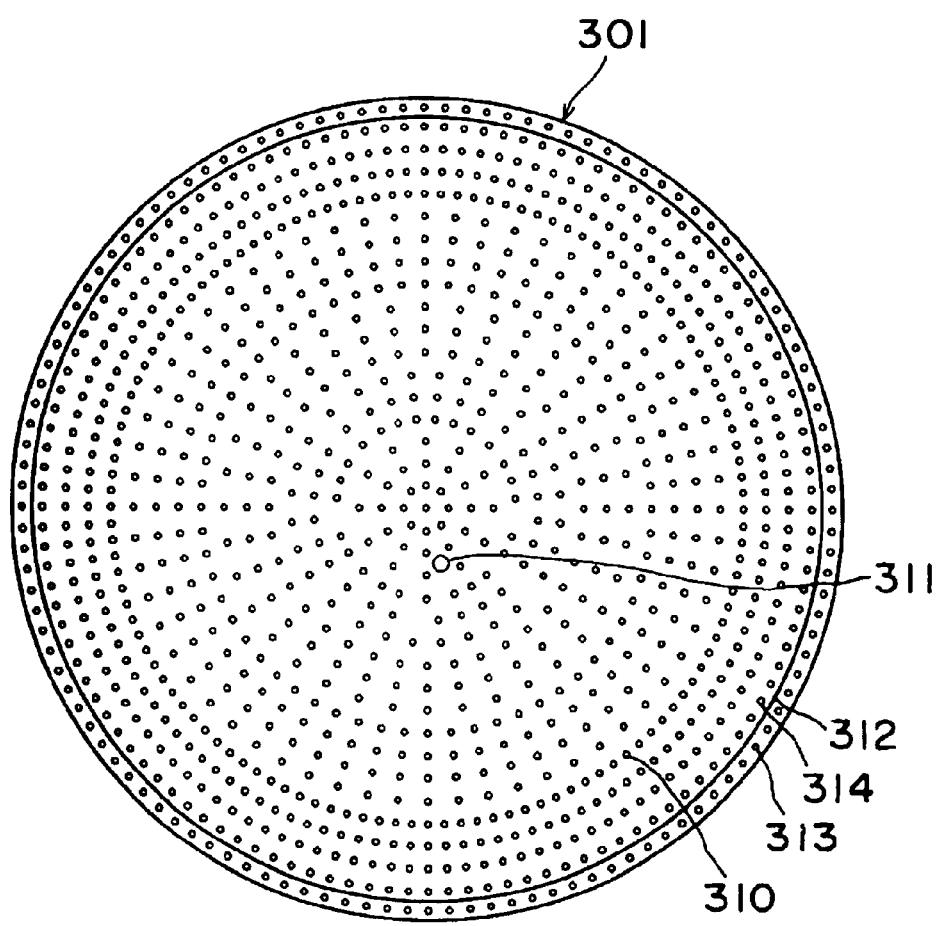
FIG. 12 is a plan view of a substrate attracting and holding system according to a further embodiment of the present invention.

FIGS. 11A and 11B show an embodiment of a substrate attracting and holding system according to the present invention, wherein FIG. 11A is a plan view and FIG. 11B is a fragmentary sectional view thereof. FIG. 12 is a plane showing a further embodiment of a substrate attracting and holding system of the present invention.

In FIGS. 11A and 11B, denoted at 301 is a chuck (substrate attracting and holding system) to be mounted on an X-Y stage of a semiconductor exposure apparatus, for example. The chuck has a supporting surface on which a substrate such as a wafer is to be placed, and the supporting surface is provided by a plurality of pin-like protrusions 310, 313 and 314 (which will hereinafter be referred to also as a "pin") for supporting a substrate. The free top end of each protrusion is finished into a super flat face by a high-precision lapping process.

The pin-like protrusions 310 shown in FIGS. 11A and 11B have a pin diameter of 0.2 mm, and they are juxtaposed in a grid-like array with a disposition pitch of L mm. There is at least one suction hole 311 for vacuum attraction, at the top face of the chuck, which is communicated with a vacuum source. In place of the grid-like disposition of the pin-like protrusions 310, they may be arrayed concentrically as shown in FIG. 12. They may be disposed in a 60-deg. staggering array, or they may be disposed at random with a pin pitch of L mm or less. An array based on combination of those described above may be used.

At the outer peripheral portion of the chuck 1, there are a plurality of pin-like (outer peripheral) protrusions 313 disposed in a circumferential shape, for supporting the outer peripheral portion of a substrate. Also, there is a ring-like partition wall 312 just inside the outer peripheral protrusions 313. The ring-like partition wall 312 has a height which is lower than the top face of the protrusions 313 by about 1 to 2 microns. This is because, with a gap of about 1–2 microns, a decrease of vacuum pressure for attraction is so small that it causes no problem. On the other hand, even if a dust particle of a diameter smaller than the difference of 1–2 microns is adhered to the partition wall 312, it does not contact the substrate. Thus, it does not cause an increase of the contract rate. In FIGS. 11A and 11B, denoted at 314 are protrusions disposed along a circumference inside the outermost protrusions 313 by one pitch, and they are disposed in juxtaposition to the inside face of the ring-like partition wall 312.

Figure 13:
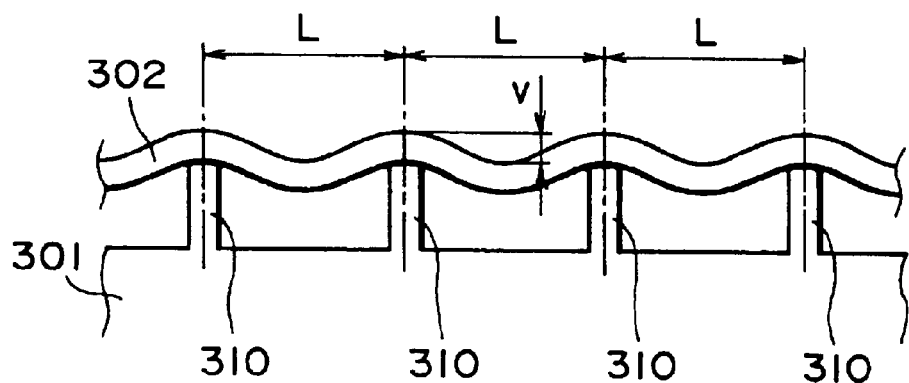
FIG. 13 is a sectional view for explaining the state of a substrate and a central portion of a chuck as the substrate is attracted and held by a substrate attracting and holding system according to the present invention.
Figure 19:
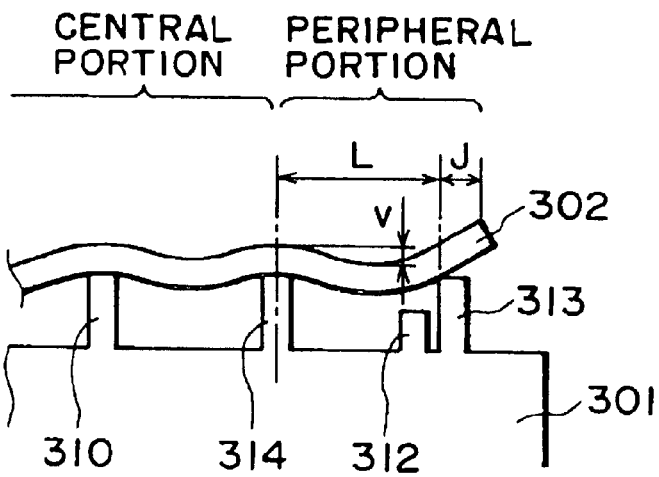
FIG. 19 is a schematic and sectional view for explaining the state of a substrate and an outer peripheral portion of a chuck, when the substrate is attracted and held by a substrate attracting and holding system according to the present invention.

With the structure of the chuck 1 described above, the substrate 302 such as a wafer is placed on the supporting surface of the chuck and, through vacuum suction applied in response to the operation of the vacuum source via the suction holes 311, the substrate 302 is supported on the chuck and attracted and held by the protrusions 310, 313 and 314 as shown in FIG. 13 or 19. Here, between the protrusions, the wafer (substrate) 2 is deformed and flexed by the vacuum attraction force, and the flatness of the wafer is degraded. Also, due to the flexure of the wafer, the wafer surface is distorted in horizontal directions to cause a positional deviation and thus a wafer distortion.

Now, the wafer flatness and the amount of wafer distortion will be considered, using a material dynamics model.

Figure 14:
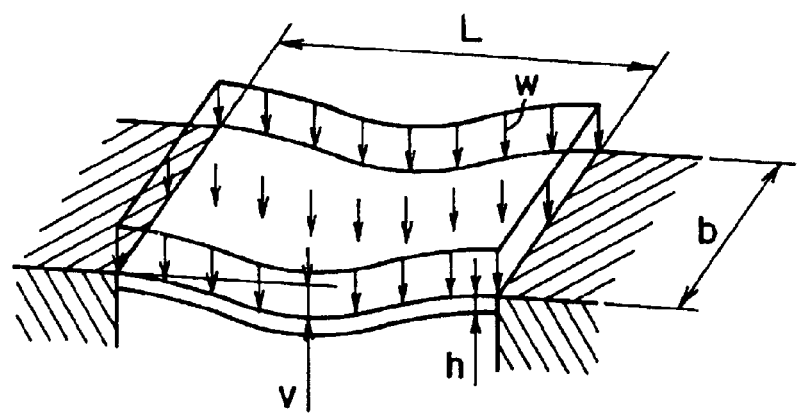
FIG. 14 is a schematic view of a model of a beam having both ends fixed, bearing a uniformly distributed load corresponding to the stage of a warp of a substrate at a central portion of a chuck.

FIG. 13 is a sectional view showing the flexure at the portion of a wafer 302 where, in the central portion of the chuck 301, there are pin-like protrusions 310 juxtaposed continuously along one direction with a pin pitch L, when the wafer is attracted and held thereby. In this example, as regards a material dynamics model, a model of a beam having its opposite ends fixed and receiving an even distributed load, as shown in FIG. 14, applies.

Here, if the width of the beam is b, the thickness thereof is h, and the sectional secondary moment is I, it follows that:

$$I=(b \cdot h^3)/12 \tag{2.1}$$

If the vacuum pressure is p and the load per a unit length is w, it follows that:

$$w=p \cdot b \tag{2.2}$$

Where the length of the beam is L and the longitudinal elasticity coefficient is E, the maximum flexure amount v of the beam is given by:

$$v=(w \cdot L^4)/(384 \cdot E \cdot I) \tag{2.3}$$

By modifying equation (2.3) by using equations (2.1) and (2.2), it follows that:

$$v=(P \cdot L^4)/(32 \cdot E \cdot h^3) \tag{2.4}$$

Namely, this means that the largest flexure amount v of the beam is not dependent upon the width b but, rather, it is determined by the vacuum pressure p, the beam length L, the longitudinal elasticity coefficient E and the thickness h. Then, the largest flexure amount v corresponds to the wafer flatness.

Next, where the coordinate of the beam in its lengthwise direction is x and the bending moment is M, it follow that:

$$M=(w \cdot L^2/2)[-1/6+x/L-x^2/L^2] \tag{2.5}$$

Figure 15:
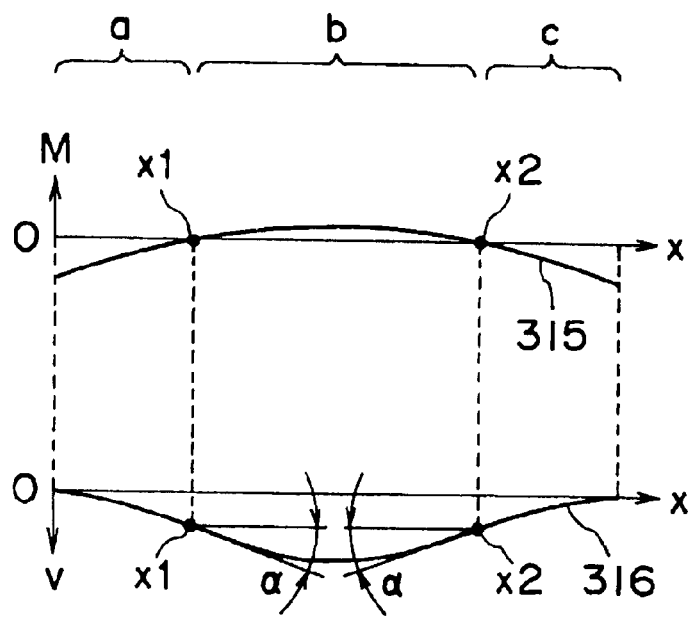
FIG. 15 is a schematic view for explaining bending moments and flexure curves curves in the double-ends fixed beam of FIG. 14.

FIG. 15 shows the relation (curve 15) between the coordinate x and the moment M as well as the flexure curve (curve 16) of the beam. As seen also from FIG. 15, the moment M is negative in ranges a and c of the coordinate x, whereas it is positive in a range b. Also, at two positions x1 and x2 where M becomes equal to zero, the tilt angle of the beam flexure curve becomes largest. Where this largest tilt angle is denoted by $\alpha$, it follows that:

$$\alpha=(\sqrt{3} w \cdot L^3)/(216 \cdot E \cdot I) \tag{2.6}$$

When this is modified by using equations (2.1) and (2.2), it follows that:

$$\alpha=(\sqrt{3} \cdot P \cdot L^3)/(18 \cdot E \cdot h^3) \tag{2.7}$$

Figure 16:
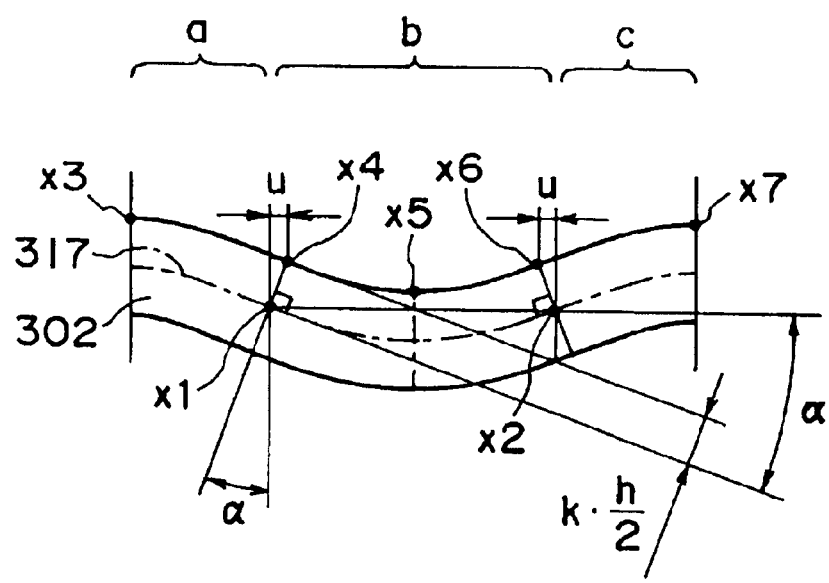
FIG. 16 is a schematic view for explaining distortion of a substrate.

Since in practice a wafer has a thickness h, if it is illustrated with exaggeration, the result is such as shown in FIG. 16. In FIG. 16, a dash-and-dot line 17 passing through the middle of the thickness h depicts a neutral plane at any position on which there occurs no elongation or contraction. At a side of the neutral plane facing the wafer surface, due to the bending moment M, there occurs an elongation, by tension, in X direction within the ranges a and c of the coordinates x. In the range b, there occurs a contraction in X direction, by compression. On the other hand, at a side of the neutral plane facing the wafer bottom surface, there occurs a contraction, by compression, in the ranges a and c of the coordinate x, while there occurs an elongation in X direction, by tension, in the range b. The amount of elongation or contraction in the X direction is proportional to the distance from the neutral plane and also, it is proportional to the tilt angle of the neutral plane. Namely, a positional deviation to be produced by the elongation/contraction of the wafer surface in the X direction resulting from the attraction, becomes equal to zero at the positions x3, x5 and x7 where the tilt angle is zero, whereas it becomes largest at the positions x4 and x6 where the tilt angle is maximum. As regards the distance from the neutral plane to the wafer surface, in a case of a monocrystal Si wafer, it may be approximately equal to h/2. However, it may differ from h/2, depending on the material or uniformess of the wafer or the substrate, the process or processes having been applied to the surface or bottom surface, the state of attraction to the chuck, for example. Thus, by taking it as k·h/2 wherein k is the neutral plane correction coefficient and if the largest positional deviation is denoted by u, it follows that:

$$u=[(h \cdot \alpha)/2] \cdot k \tag{2.8}$$

When this is modified by using equation (2.7), it follows that:

$$u=[(\sqrt{3} \cdot P \cdot L^3)/(36 \cdot E \cdot h^2)] \cdot k \tag{2.9}$$

Namely, this means that the largest positional deviation amount u on the wafer surface is not dependent upon the width b but, rather, it is determined by the neutral plane correction coefficient k, the vacuum pressure p, the beam length L, the longitudinal elasticity coefficient E and the thickness h. Since the exposure process is performed in this state, the image to be printed on the wafer is an image being distorted relatively to the wafer by an amount corresponding to the positional deviation. Therefore, the largest positional deviation u corresponds to the wafer distortion.

While the explanation above has been made to a one-dimensional beam model in respect to the portion where the pin-like protrusions 310 are juxtaposed continuously along one direction with a pin pitch L, practically the pin array comprises a two-dimensional array. Depending on the disposition used, such as grid-like disposition, circumferential disposition, 60-deg. staggering disposition, random disposition or the like, the values of the largest flexure amount v and the largest positional deviation u are variable. In consideration of it, where the wafer flatness as a flat wafer is attracted in practice is $V_1$, the wafer distortion is $U_1$ and the correction coefficients depending on the pin disposition are $c_1$ and $c_2$, it follows that:

$$V_1 = v \cdot c_1 = [(P \cdot L^4)/(32 \cdot E \cdot h^3)] \cdot c_1 \quad (2.10)$$

$$U_1 = u \cdot c_2 = [(\sqrt{3} \cdot P \cdot L^3)/(36 \cdot E \cdot h^2)] \cdot k \cdot c_2 \quad (2.11)$$

Figure 17:
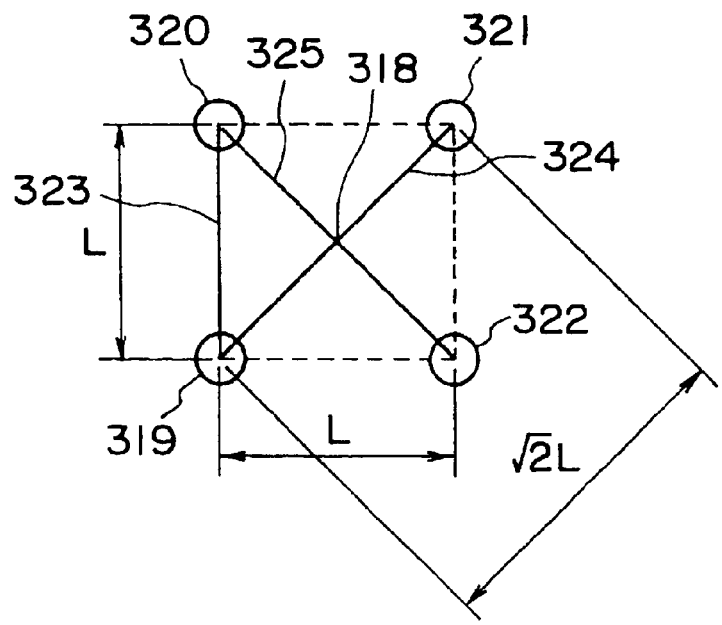
FIG. 17 is a schematic view for explaining disposition of pins in a grid layout.

In the case of grid-like disposition, as shown in FIG. 17, since the largest flexure occurs at the position of the center 318 of four pins 319–323, it can be regarded that the flexure becomes larger than that of a case where a beam 323 supported by the pins 319 and 323 is considered and the flexure is calculated while taking the length as L, and also that it becomes smaller than that of a case where a beam 324 as supported by diagonal protrusions 319 and 321, of the four pins, is considered and the flexure is calculated while taking the length as $L \cdot 2^{1/2}$. Therefore, it can be regarded that the correction coefficient $c_1$ becomes equal to 1 to 4 $(=(2^{1/2})^4)$ while the correction coefficient $c_2$ becomes equal to 1 to 2.8 $(=(2^{1/2})^3)$. Since however the beam 324 supported by the diagonal pins 319 and 321 and the beam 325 supported by the diagonal pins 320 and 322 may be flexed independently, by the same amount, the value may be close to that as determined while taking the beam length as $L \cdot 2^{1/2}$.

Figure 18:
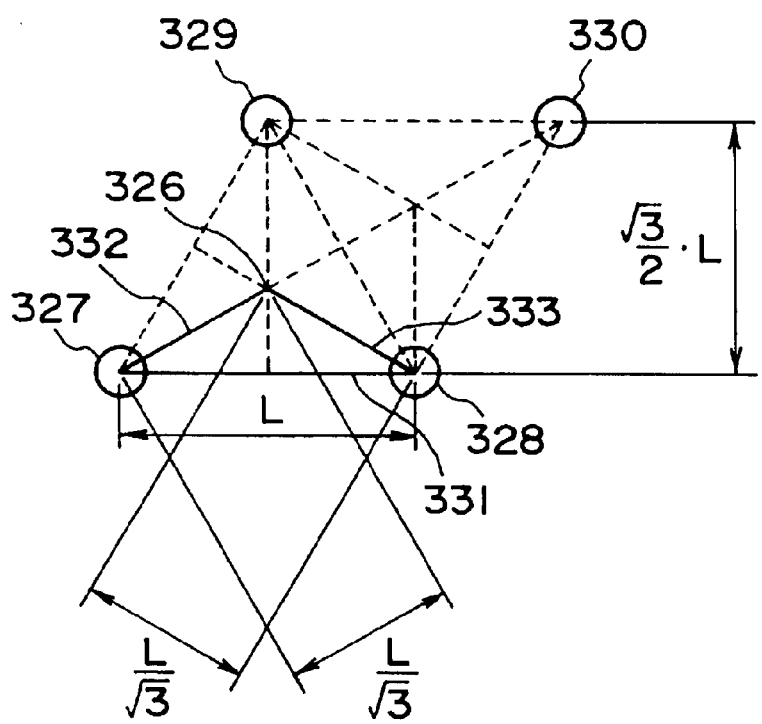
FIG. 18 is a schematic view for explaining disposition of pins in a 60-deg. staggering grid layout.

On the other hand, in the case of 60-deg. staggering disposition, as shown in FIG. 18, the largest flexure occurs at the position of the center 326 of three pins. Therefore, it can be regarded that the flexure becomes larger than that of a case where a beam 331 supported by the pins 327 and 331 is considered and the flexure is calculated while taking the length as L, and also that it becomes smaller than that of a case where a beam 333 passing through the center 326 of the three pins and being supported by pins 327 and 328 is considered and the flexure is calculated while taking the length as $L \cdot \tfrac{2}{3}^{1/2}$. Therefore, it can be regarded that the correction coefficient $c_1$ becomes equal to 1 to 1.8 $(=(\tfrac{2}{3}^{1/2})^4)$ while the correction coefficient $c_2$ becomes equal to 1 to 1.5 $(=(\tfrac{2}{3}^{1/2})^3)$.

Further, in the case of circumferential disposition or random disposition, it may be considered as a modification of the grid-like disposition or the 60-deg. staggering disposition. Depending on the degree of modification, the values of the correction coefficients are changed. However, with a small modification, it can be regarded substantially the same as the grid-like disposition or the 60-deg. staggering disposition. The correction coefficients may be of the same values.

In practice, the correction coefficients $c_1$ and $c_2$ may be calculated on the basis of FEM, for each of different poi dispositions, by which they can be determined more accurately. Further, the correction coefficient $c_1$ or $k \cdot c_2$ may be evaluated on the basis of experiments, by which it can be determined more accurately.

Since the wafer flatness $V_1$ and the wafer distortion $U_1$ as a flat wafer is attracted in practice are expressed by equations (2.10) and (2.11), if a wafer flatness tolerance as being tolerable in a chuck is dz and similarly the wafer distortion tolerance is dxdy, it follows that:

$$dz \geq [(P \cdot L^4)/(32 \cdot E \cdot h^3)] \cdot c_1 \quad (2.12)$$

$$dxdy \geq [(\sqrt{3} \cdot P \cdot L^3)/(36 \cdot E \cdot h^2)] \cdot k \cdot c_2 \quad (2.13)$$

Here, once a wafer (substrate) to be attracted is determined, then the longitudinal elasticity coefficient E, the thickness h and the neutral plane correction coefficient k are determined. If the pin (protrusion) disposition is fixed, the correction coefficients $c_1$ and $c_2$ based on the pin disposition are determined. Therefore, a suitable combination of a vacuum pressure P and a pin pitch L, satisfying the conditions of equations (2.12) and (2.13), can be selected.

Namely, when equations (2.12) and (2.13) are modified, it follows that:

$$P \leq [(32 \cdot E \cdot h^3 \cdot dz)/c_1] \cdot (1/L^4) \quad (2.14)$$

$$P \leq [(36 \cdot E \cdot h^2 \cdot dxdy)/(\sqrt{3} \cdot k \cdot c_2)] \cdot (1/L^3) \quad (2.15)$$

Thus, by arranging the chuck with a vacuum pressure P and a pin pitch L, satisfying both of equations (2.14) and (2.15), the wafer flatness and the distortion can be made smaller than the tolerances dz and dxdy, respectively.

On the other hand, as regards these two conditions, if the pin pitch L is not greater than a certain value and as long as the condition of equation (2.15) is satisfied, the condition of equation (2.14) is also satisfied. This value for the pitch L can be determined under a condition that the right side of equation (2.15) is smaller than the right side of equation (2.14), and it is given as follows:

$$L \leq [(8 \cdot \sqrt{3} \cdot k \cdot c_2)/(9 \cdot c_1)] \cdot [(h \cdot dz)/dxdy] \quad (2.16)$$

Namely, within the range in which the pin pitch L satisfies equation (2.16), a chuck with a vacuum pressure P and a pin pitch L satisfying equation (2.15) may be used.

Thus, now a case wherein a typical Si wafer of a diameter 200 mm is attracted and held by a pin chuck having a grid-like pin disposition is considered. It is taken that the longitudinal elasticity coefficient $E = 1.69 \times 10^{11}$ N/m, the thickness $h = 0.725$ mm, the neutral plane correction coefficient $k = 1$, the correction coefficients $c_1 = 4$ and $c_2 = 2.8$. Also, in a semiconductor process of 0.25 micron rule, currently being mass-produced, the wafer flatness tolerance dz is 80 nm, when taken as 10% of the depth of focus 800 nm. The wafer distortion tolerance dxdy is 5 nm, when taken as 10% of the overlay precision 50 nm. Then, while taking the unit of pressure P is $N/m^2$ and the unit of pitch L is m, from equations (2.15) and (2.16), it follows that:

$$P \leq 0.0033/L^3 \quad (2.17)$$

$$L \leq 0.0125 \quad (2.18)$$

It is seen that, when the pin pitch L is not greater than 12.5 mm, a vacuum pressure P and a pin pitch L satisfying equation (2.17) may be used. Since, generally, the pin pitch L is not greater than 5 mm, to be described later, it applies to that.

Here, it should be noted that, in the normal pin pitch, satisfaction of only equation (2.15) is accompanied by satisfaction of equation (2.14) means that there is a more strict condition involved in reducing the wafer distortion to a tolerance or smaller; as compared with improving the wafer flatness. In order to clarify this, the ratio of the wafer flatness $V_1$ and the wafer distortion $U_1$ may be detected from equations (2.10) and (2.11). If follows that:

$$V_1/U_1=[(9 \cdot c_1)/(8 \cdot \sqrt{3} \cdot k \cdot c_2)] \cdot (L/h) \quad (2.19)$$

By substituting typical coefficients similar to those described above, into this equation, it follows that:

$$V_1/U_1=1280 \cdot L \quad (2.20)$$

This means that, if the pin pitch L is 2 mm, for example, there occurs a wafer distortion $U_1$ corresponding to 1/2.6 of the wafer flatness $V_1$. Namely, it means that, if the tolerance for the wafer distortion is 5 nm, only a wafer flatness of 13 nm is allowed. This value is extraordinarily strict as compared with the wafer flatness tolerance of 80 nm, determined by the depth of focus. Also, if the pin pitch L is large, the rate of wafer distortion production relative to the wafer flatness becomes small. It can not reach the rate of wafer distortion tolerance relative to the wafer flatness tolerance, unless a pin pitch L is set to 12.5 mm.

Figure 25:
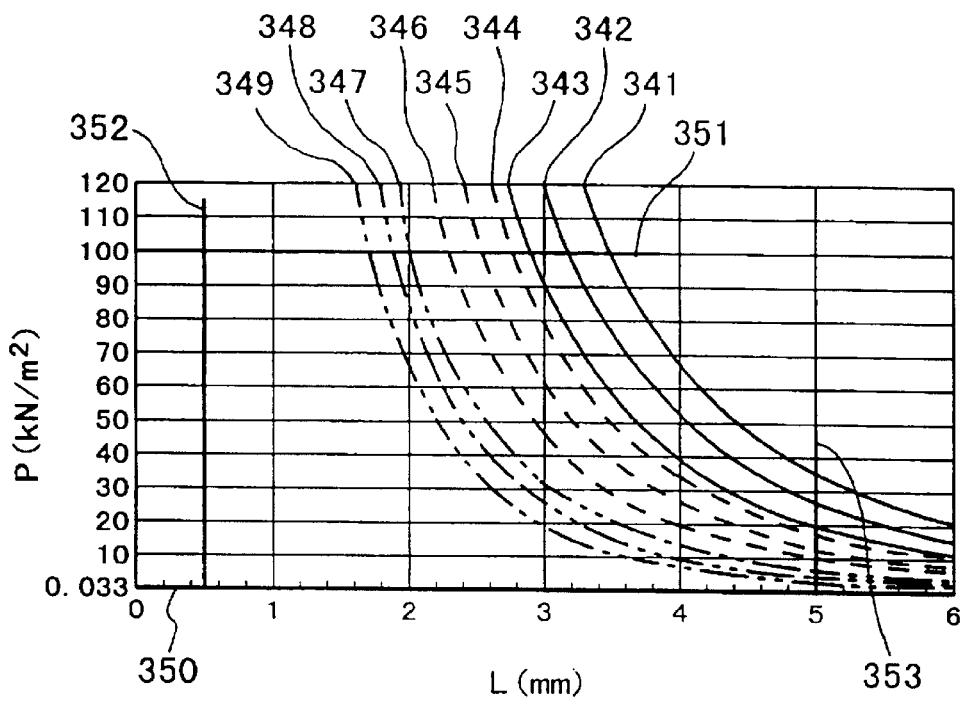
FIG. 25 is a graph for explaining an example of a vacuum pressure at the central portion of a substrate and the range of pin pitch, in a substrate attracting and holding system of the present invention.

Next, referring to FIG. 25, the range of practical values for the vacuum pressure P and the pin pitch L will be described. FIG. 25 is a graph wherein the pin pitch L is taken on the axis of abscissa, and the vacuum pressure P is taken on the axis of ordinate. The range for the vacuum pressure P and the pin pitch L satisfying equation (2.17) is at the lower left zone of a solid line 342.

Although equation (2.17) has been determined with reference to a Si wafer of a diameter 200 mm, having a thickness h=0.725 mm, a Si wafer of a diameter 125 mm may have a thickness h=0.725 mm and, in that occasion, it follows that:

$$P \leq 0.00245/L^3 \quad (2.21)$$

Thus, in FIG. 25, the range corresponds to a lower left zone below a solid line 343.

Further, for a Si wafer of 300 mm diameter, the thickness is h=0.775 mm. Also, it is expected that wafers of a larger diameter such as 400 mm Si wafers are used in future. The thickness will be come h=about 0.825 mm. In consideration of this, the value is calculated with a thickness h=0.825 mm. Then, it follows that:

$$P \leq 0.00427/L^3 \quad (2.22)$$

In FIG. 25, it corresponds to a lower left zone below a solid line 341.

Further, with further miniaturization of a semiconductor device, the semiconductor process will change to 0.18 micron rule, 0.13 micron rule or to 0.1 micron rule. With these changes, improvements in the overlay precision are absolutely required. Thus, it is expected that the tolerance for wafer distortion is changed to a much strict value, such as from 5 nm to 2.5 nm and to 1 nm.

In consideration of the above, the value is calculated on the basis of a wafer distortion tolerance dxdy=2.5 nm and a thickness h=0.825 mm. It follows that:

$$P \leq 0.00213/L^3 \quad (2.23)$$

In FIG. 25, it corresponds to a lower left zone below a solid line 344.

Similarly, when the value is calculated with a wafer distortion tolerance dxdy=2.5 nm and a thickness h=0.725 mm, it follows that:

$$P \leq 0.00165/L^3 \quad (2.24)$$

In FIG. 25, it corresponds to a lower left zone below a solid line 345.

Similarly, when the value is calculated with a wafer distortion tolerance dxdy=2.5 nm and a thickness h=0.625 mm, it follows that:

$$P \leq 0.00123/L^3 \quad (2.25)$$

In FIG. 25, it corresponds to a lower left zone below a solid line 346.

Further, when the value is calculated with a wafer distortion tolerance dxdy=1 nm and a thickness h=0.825 mm, it follows that:

$$P \leq 0.00085/L^3 \quad (2.26)$$

In FIG. 25, it corresponds to a lower left zone below a solid line 347.

Similarly, when the value is calculated with a wafer distortion tolerance dxdy=1 nm and a thickness h=0.725 mm, it follows that:

$$P \leq 0.00066/L^3 \quad (2.27)$$

In FIG. 25, it corresponds to a lower left zone below a solid line 348.

Similarly, when the value is calculated with a wafer distortion tolerance dxdy=1 nm and a thickness h=0.625 mm, it follows that:

$$P \leq 0.00049/L^3 \quad (2.28)$$

In FIG. 25, it corresponds to a lower left zone below a solid line 349.

As described above, the practical range for the vacuum pressure P and the pin pitch L at the wafer central portion has been considered in accordance with equation (2.15) and in respect to various values of the wafer thickness h and the wafer distortion tolerance dxdy. In these examples, since the range of the pin pitch L as determined by equation (2.16) satisfies a standard pin pitch (not greater than 5 mm) to be described later, the condition of equation (2.14) is also satisfied. This is because, even in a case where the right side of equation (2.16) becomes smallest, that is, even in the case of a smallest thickness h=0.625 mm and a largest dxdy=5 nm, a relation L≦0.011 is given such that the standard pin pitch 5 mm to be described later is satisfied. Therefore, by arranging the chuck with a vacuum pressure P and a pin pitch L, at the wafer central portion, which are selected out of the range described above, a desired wafer flatness tolerance dz and a desired wafer distortion tolerance dxdy can be satisfied.

The ordinary range for the vacuum pressure P of the chuck will be, under different conditions of the chuck, as follows. First, the smallest vacuum pressure which can be used in practice, is determined by the condition for holding a wafer even if an X-Y stage for holding the chuck moves at a largest acceleration. Namely, if the largest acceleration of the X-Y stage is G, the stationary friction coefficient is $\mu$, the wafer area of (s), the wafer density is $\rho$, then it follows that:

$$P \cdot (s) \cdot \mu \geq G \cdot (s) \cdot h \cdot \rho \quad (2.29)$$

Namely, it follows that:

$$P \geq G \cdot h \cdot \rho/\mu \quad (2.30)$$

Here, if the largest acceleration of the X-Y stage G=0.2× 9.8=1.96 m/s$^2$, the stationary friction coefficient $\mu$=0.1, the thickness h=0.625 mm, the wafer density ρ=2330 Kg/m², then it follows that:

$$P \geq 33 \tag{2.31}$$

In FIG. 25, it corresponds to an upper zone above a solid line 350.

Next, the largest vacuum pressure P which can be used in practice is, if the atmospheric pressure is 100 kN/m², as follows:

$$P \leq 100000 \tag{2.32}$$

In FIG. 25, it corresponds to a lower zone below a solid line 351.

On the other hand, an ordinary range for the pin pitch L of the chuck will be, under different conditions of the chuck, as follows. The smallest pin pitch L which can be used in practice is determined by the contact rate between the chuck and the wafer. Therefore, the relation between the pin pitch and the contact rate will be described first. If the number of pins per a unit area is n, since in the grid-like disposition shown in FIG. 7, there is one pin in the area as enclosed by the centers of the four pins 319–322, it follows that:

$$n=1/L^2 \tag{2.33}$$

Further, in the case of the 60-deg. staggering disposition shown in FIG. 18, there is one pin in the area as enclosed by four pins 327–330, it follows that:

$$n(\tfrac{2}{3}^{1/2})/L^2 \tag{2.34}$$

Further, where the area at the free end of each pin is denoted by s and the wafer-to-pin contact rate is denoted by N, since N=s·n, it follows that:

In the case of grid-like disposition:

$$N=s/L^2 \tag{2.35}$$

In the case of 60-deg. staggering disposition:

$$N=(\tfrac{2}{3}^{1/2}) \cdot s/L^2 \tag{2.36}$$

Therefore, the wafer-to-pin contact rate N is determined by the area s at the free end face of the pin and the pin pitch L. According to experiences of semiconductor processes, the practical contact rate N is about 0.008 in a case where the pin pitch L is about 2 mm, and the pin free end face has a diameter 0.2 mm, namely, the area s of the free end face of the pin is s=π·(0.1)²=0.0314 mm². Thus, by machining the pin free end face to a diameter of about 0.05 mm, the pin pitch L can be reduced to 0.5 mm while keeping the contact rate of substantially the same level. Thus, it follows that:

$$L \geq 0.0005 \tag{2.37}$$

In FIG. 25, it corresponds to a right-hand side zone of a solid line 352.

Next, the largest pin pitch L which can be used in practice is determined by the periodicity of a local warp of the wafer. In practice, a wafer has various warps of different periodicities, such as those from a global warp extending throughout the wafer to a warp having a very fine periodicity. It is an important function of a wafer chuck to correct these warps to accomplish the flatness. However, with a pin chuck, it is in principle unable to correct a warp having a periodicity smaller than the pin pitch. Namely, it is necessary to make the pin pitch smaller than the smallest periodicity of a warp, of an amplitude of about 13 nm, which may have an adverse influence as a wafer distortion. In order to accomplish a positive correction effect, a pin pitch not greater than a half of the smallest periodicity has to be used. As regards the periodicity of a wafer warp, while details are not known because of difficulties in separation from the thickness non-uniformness or of the measuring precision, it should be expected that a warp of a period of about 10 mm at the largest may remain though the wafer warp may be improved in future. In consideration of it, the pin pitch should desirably be set to be 5 mm or less.

$$L \leq 0.005 \tag{2.38}$$

In FIG. 25, it corresponds to a zone on the left-hand side of a solid line 353.

It is seen from the above that the practical range for the vacuum pressure P and the pin pitch L are determined in accordance with equations (2.22), (2.31), (2.32), (2.37) and (2.38), as follows:

$$P \leq 0.00427/L^3$$

$$33 \leq P \leq 100000$$

$$0.0005 \leq L \leq 0.005 \tag{2.39}$$

In FIG. 25, it corresponds to the range as enclosed by solid lines 341, 351, 352, 350 and 353.

While the foregoing description has been made with reference to the portion where the pin-like protrusions 310 are juxtaposed continuously along one direction with a pin pitch L, that is, the central portion of the chuck inside the outer peripheral portion thereof, description will now be made on the outer peripheral portion of the chuck. FIG. 19 is a sectional view for explaining flexure of a wafer 2 as attracted and held by the outer peripheral potion of the chuck. In this drawing, the partition wall 312 is provided just inside the outermost circumferential protrusion 313, and the height of the partition wall 312 is made lower than the top face of the protrusion 313 by about 1–2 microns. This is because, with a gap of about 1–2 microns, a decrease of vacuum pressure for attraction is so small that it causes no problem. On the other hand, even if a dust particle of a diameter smaller than the difference of 1–2 microns is adhered to the partition wall 312, it does not contact the substrate. Thus, it does not cause an increase of the contract rate.

Figure 20:
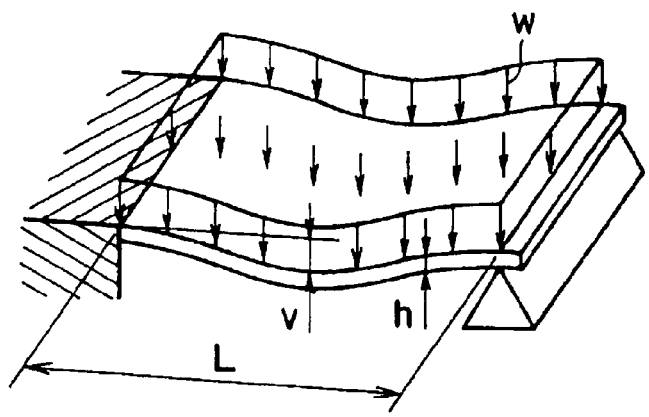
FIG. 20 is a schematic view of a beam having an end fixed and another free end, bearing a uniformly distributed load corresponding to the state of a warp of a substrate, at the outer peripheral portion of the chuck.

As regards a material dynamics model for the state of flexure of a wafer at the outer peripheral portion of the chuck, a model of a beam having a fixed end and another free end and receiving a even distributed load, as shown in FIG. 20, applies. However, the outermost circumferential pin 313 supports a wafer 302 with its corner, not the center of the pin, as shown in FIG. 19. The pin pitch L in this case is the distance from the inside corner of the pin 313 to the pin 314 which is located inside thereof by one pitch.

Where the maximum flexure amount is denoted by v, it is expressed as follows:

$$v=(w \cdot L^4)/(184.6 \cdot E \cdot I) \tag{2.40}$$

By modifying this equation by using equations (2.1) and (2.2), it follows that:

$$v=(P \cdot L^4)/(15.38 \cdot E \cdot h^3) \tag{2.41}$$

Also, the tilt angle of the beam flexure curve becomes largest at the supporting position of the outermost pin 313. If this largest tilt angle is denoted by α, it follows that:

$$\alpha=(w \cdot L^3)/(48 \cdot E \cdot I) \tag{2.42}$$

When this is modified by using equations (2.1) and (2.2), it follows that:

$$\alpha = (P \cdot L^3)/(4 \cdot E \cdot h^3) \quad (2.43)$$

Thus, from equation (2.8), the largest positional deviation u is give as follows:

$$u = [(P \cdot L^3)/(8 \cdot E \cdot h^2)] \cdot k \quad (2.44)$$

Therefore, where the wafer flatness as a flat wafer is attracted in practice is $V_2$, the wafer distortion is $U_2$ and the correction coefficients depending on the pin disposition, like those of the wafer central portion, are $c_1$ and $c_2$, it follows that:

$$V_2 = v \cdot c_1 = [(P \cdot L^4)/(15.38 \cdot E \cdot h^3)] \cdot c_1 \quad (2.45)$$

$$U_2 = u \cdot c_2 = [(P \cdot L^3)/(8 \cdot E \cdot h^2)] \cdot k \cdot c_2 \quad (2.46)$$

Since the wafer flatness $V_1$ and the wafer distortion $U_1$ as a flat wafer is attracted in practice are expressed by equations (2.10) and (2.11), also in the case of the wafer outer peripheral portion, if a wafer flatness tolerance as being tolerable in a chuck is dz and similarly the wafer distortion tolerance is dxdy, it follows that:

$$dz \geq [(P \cdot L^4)/(15.38 \cdot E \cdot h^3)] \cdot c_1 \quad (2.47)$$

$$dxdy \geq [(P \cdot L^3)/(8 \cdot E \cdot h^2)] \cdot k \cdot c_2 \quad (2.48)$$

When equations (2.47) and (2.48) are modified, it follows that:

$$P \leq [(15.38 \cdot E \cdot h^3 \cdot dz)/c_1] \cdot (1/L^4) \quad (2.49)$$

$$P \leq [(8 \cdot E \cdot h^2 \cdot dxdy)/(k \cdot c_2)] \cdot (1/L^3) \quad (2.50)$$

Thus, by arranging the chuck with a vacuum pressure P and a pin pitch L, satisfying both of equations (2.49) and (2.50), the wafer flatness and the distortion can be made smaller than the tolerances dz and dxdy, respectively.

On the other hand, as regards these two conditions, if the pin pitch L is not greater than a certain value and as long as the condition of equation (2.50) is satisfied, the condition of equation (2.49) is also satisfied. This value for the pitch L can be determined under a condition that the right side of equation (2.50) is smaller than the right side of equation (2.49), and it is given as follows:

$$L \leq [(1.92 \cdot k \cdot c_2)/c_1] \cdot [(h \cdot dz)/dxdy] \quad (2.51)$$

Namely, within the range in which the pin pitch L satisfies equation (2.51), a chuck with a vacuum pressure P and a pin pitch L satisfying equation (2.50) may be used.

Thus, now a case wherein a typical Si wafer of a diameter 200 mm is attracted and held by a pin chuck having a grid-like pin disposition is considered, like the example of the wafer central portion described hereinbefore. It is taken that the longitudinal elasticity coefficient $E = 1.69 \times 10^{11}$ N/m, the thickness $h = 0.725$ mm, the neutral plane correction coefficient $k = 1$, the correction coefficients $c_1 = 4$ and $c_2 = 2.8$. Also, in a semiconductor process of 0.25 micron rule, the wafer flatness tolerance dz is 80 nm and the wafer distortion tolerance dxdy is 5 nm. Then, while taking the unit of pressure P is N/m² and the unit of pitch L is m, from equations (2.50), it follows that:

$$P \leq 0.0127/L^3 \quad (2.52)$$

Figure 26:
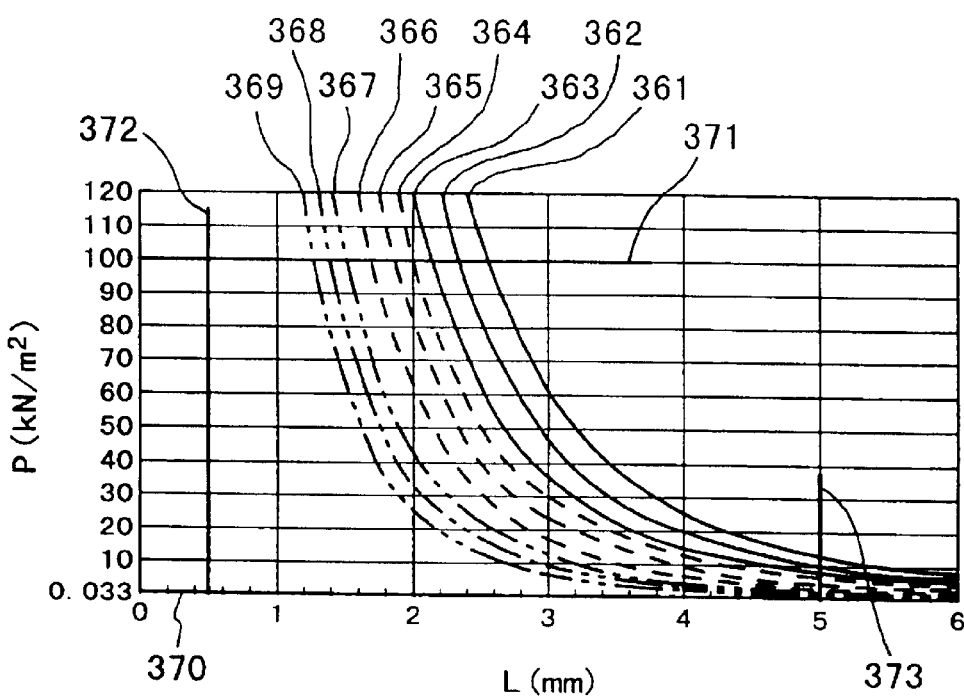
FIG. 26 is a graph for explaining an example of a vacuum pressure at the outer peripheral portion of a substrate and the range of pin pitch, in a substrate attracting and holding system of the present invention.

FIG. 26 is a graph for explaining the range for the vacuum pressure P and the pin pitch L which can be used in practice, wherein the pin pitch L is taken on the axis of abscissa, and the vacuum pressure P is taken on the axis of ordinate. In FIG. 26, the range for the vacuum pressure P and the pin pitch L satisfying equation (2.52) is at the lower left zone below a solid line 362.

When the range is calculated with a thickness $h = 0.626$ mm, it follows that:

$$P \leq 0.00094/L^3 \quad (2.53)$$

Thus, in FIG. 26, the range corresponds to a lower left zone below a solid line 363.

Similarly, when the range is calculated for a thickness $h = 0.825$ mm, it follows that:

$$P \leq 0.00164/L^3 \quad (2.54)$$

In FIG. 26, it corresponds to a lower left zone below a solid line 361.

Also, when the range is calculated for a wafer distortion tolerance dxdy=2.5 nm and a thickness $h = 0.825$ mm, it follows that:

$$P \leq 0.00082/L^3 \quad (2.55)$$

In FIG. 26, it corresponds to a lower left zone below a solid line 364.

Similarly, when the range is calculated for dxdy=2.5 nm and $h = 0.725$ mm, it follows that:

$$P \leq 0.00063/L^3 \quad (2.56)$$

In FIG. 26, it corresponds to a lower left zone below a solid line 365.

Similarly, when the range is calculated for dxdy=2.5 nm and $h = 0.625$ mm, it follows that:

$$P \leq 0.00047/L^3 \quad (2.57)$$

In FIG. 26, it corresponds to a lower left zone below a solid line 366.

Also, when the range is calculated for dxdy=1 nm and $h = 0.825$ mm, it follows that:

$$P \leq 0.00033/L^3 \quad (2.58)$$

In FIG. 26, it corresponds to a lower left zone below a solid line 367.

Similarly, when the range is calculated for dxdy=1 nm and $h = 0.725$ mm, it follows that:

$$P \leq 0.00025/L^3 \quad (2.59)$$

In FIG. 26, it corresponds to a lower left zone below a solid line 368.

Similarly, when the range is calculated for dxdy=1 nm and $h = 0.625$ mm, it follows that:

$$P \leq 0.00019/L^3 \quad (2.60)$$

In FIG. 26, it corresponds to a lower left zone below a solid line 369.

As described above, the practical range for the vacuum pressure P and the pin pitch L at the wafer outer peripheral portion has been considered in accordance with equation (2.50) and in respect to various values of the wafer thickness h and the wafer distortion tolerance dxdy. In these examples, since the range of the pin pitch L as determined by equation (2.51) satisfies a standard pin pitch (not greater than 5 mm) to be described later, the condition of equation (2.49) is also satisfied. This is because, even in a case where the right side of equation (2.51) becomes smallest, that is, even in the case of a smallest thickness h=0.625 mm and a largest dxdy=5 nm, a relation L≦0.013 is given such that the standard pin pitch 5 mm to be described later is satisfied. Therefore, by arranging the chuck with a vacuum pressure P and a pin pitch L, also at the wafer outer peripheral portion, which are selected out of the range described above, a desired wafer flatness tolerance dz and a desired wafer distortion tolerance dxdy can be satisfied.

Here, it should be noted that, in the normal pin pitch, satisfaction of only equation (2.50) is accompanied by satisfaction of equation (2.49) means that there is a more strict condition involved in reducing the wafer distortion to a tolerance or smaller, as compared with improving the wafer flatness.

By the way, the ordinary range for the chuck vacuum pressure P is defined by equations (2.31) and (2.32) like the case of the wafer central portion, and in FIG. 26, it corresponds to a zone above a solid line 370 and a zone below a solid line 371.

On the other hand, the ordinary range for the pin pitch L of the chuck is defined by equations (2.37) and (2.38), like the case of the wafer central portion, and in FIG. 26, it corresponds to a zone on the right-hand side of a solid line 372 and a zone on the left-hand side of a solid line 373.

It is seen from the above that the practical range for the vacuum pressure P and the pin pitch L are determined in accordance with equations (2.54), (2.31), (2.32), (2.37) and (2.38), as follows:

$$P \leq 0.00164/L^3$$

$$33 \leq P \leq 100000$$

$$0.0005 \leq L \leq 0.005 \tag{2.61}$$

Thus, in FIG. 26, it is a zone as enclosed by solid lines 361, 371, 372, 370 and 373.

As described above, because the wafer central portion and the wafer peripheral portion are different in respect to the manner of supporting the wafer, the chuck may be structured to have respective vacuum pressures P and respective pin pitches L selected out of the ranges described hereinbefore, by which a desired wafer flatness tolerance dz and a desired wafer distortion tolerance dxdy can be satisfied throughout the whole wafer surface.

At the wafer central portion and the wafer peripheral portion, a common vacuum pressure P and/or a common pin pitch L may be set, within the ranges described hereinbefore. Alternatively, they may be set independently of each other. Where vacuum pressures P should be set independently of each other, in addition to the outermost peripheral partition wall 312, a continuous inside partition wall may be provided so as to connect all the pins 314 disposed circumferentially inside the outermost pins 313 by one pitch, and vacuum suction opening bores may be formed in the wafer central portion and the wafer peripheral portion of the chuck such that vacuum pressures can be supplied to them independently. Further, as regards the inner partition wall, a ring-like partition wall 334 (FIG. 21) may be provided with a small inward shift from the pin 314. This facilitates formation of a step at the inner partition wall 334. The height of the inner partition wall should preferably be made lower than the top face of the pin 314 by 1–2 microns. This is because, in that structure, it does not contact a wafer even if the same is warped. Also, if a dust particle of a diameter smaller than that spacing is adhered, it does not contact the wafer. The contract rate is not raised.

Where the height of the inner partition wall is made lower than the top face of the pin 314 and a vacuum pressure is supplied only to the wafer central portion, the vacuum pressure at the wafer peripheral portion can be made lower than that at the wafer central portion. Alternatively, an opening bore being communicated with the atmosphere may be formed in the wafer central portion, and a vacuum pressure may be supplied only to the wafer peripheral portion. In that occasion, the vacuum pressure at the wafer peripheral portion can be held higher than that at the wafer central portion. In this case, only a single vacuum supplying line is necessary.

Figure 21:
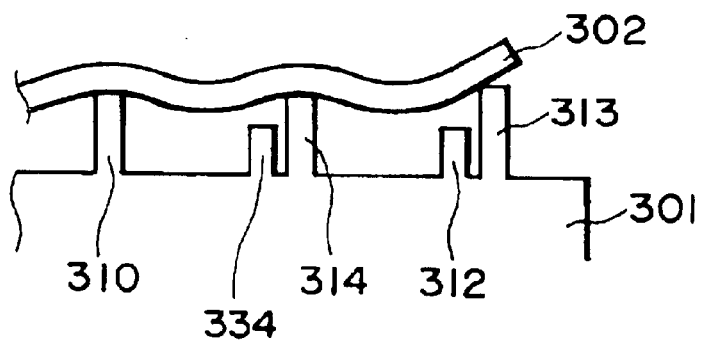
FIG. 21 is a schematic and sectional view of an outer peripheral portion of a chuck of a substrate attracting and holding system, according to a yet further embodiment of the present invention.

While the outermost partition wall 312 is disposed with a slight inward shift from the pin 313 as shown in FIG. 19 or 21, it may be provided outside the pin 313. Alternatively, a continuous partition wall for connecting all the pin 313 may be provided so as to surround the chuck peripheral portion. As a further alternative, while the contact rate becomes larger, the pins 313 may be omitted and, in place thereof, an outermost partition wall of the same height as the top face of the pin 313 may be provided.

Arranging the structure so that the vacuum pressure P can be set independently at the wafer central portion and the wafer peripheral portion, as described above, enables that the vacuum pressure at the wafer central portion is set to assure that the wafer can be held even if the X-Y stage moves at its maximum acceleration, for example, while the vacuum pressure at the wafer peripheral portion is set to assure that even a wafer having a large warp throughout the whole wafer can be attracted. More specifically, by setting the vacuum pressure at the wafer peripheral portion higher than that at the wafer central portion, and by making the pin pitch narrow, the attraction of the wafer at the wafer peripheral portion can be assured regardless of the presence/absence of a wafer warp. This enables good flatness correction at the peripheral portion as well as good correction of the wafer distortion. The vacuum pressure at the wafer central portion may be kept at a lowest level for wafer holding, by which the pin pitch can be made large. This enables decreasing the contact rate.

Further, the same pin pitch may be set at the wafer central portion and the wafer peripheral portion, while on the other hand, the vacuum pressure at the peripheral portion may be set appropriately lower than that at the wafer central portion. This enables setting the same distortion amount at the wafer central portion and the peripheral portion, thus avoiding an increase of the contact rate.

Figure 27A:
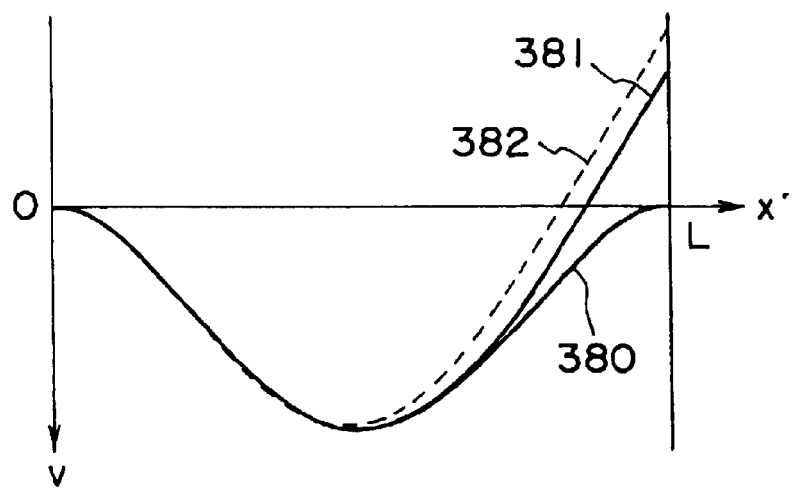
Figure 27B:
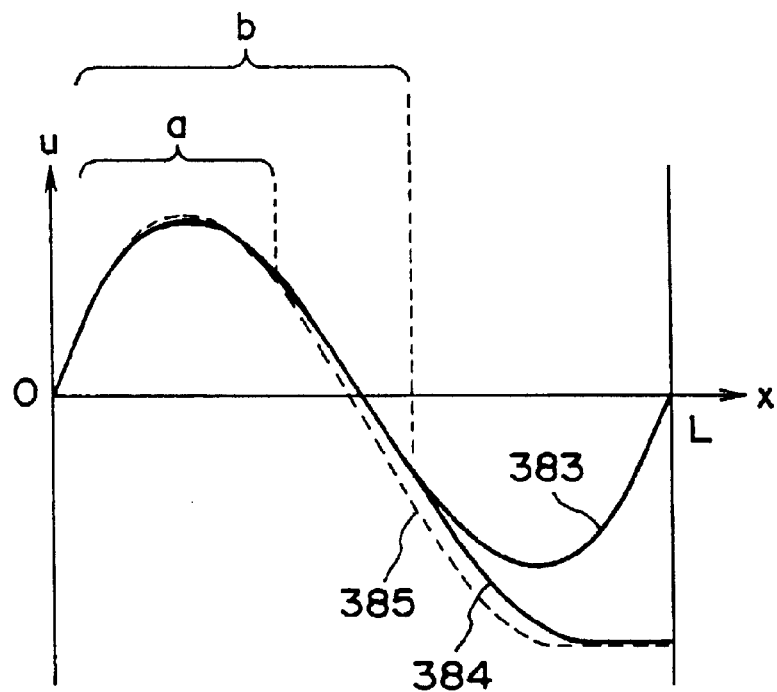

The vacuum pressure at the peripheral portion may set appropriately lower than that at the wafer central portion and the pin pitch may be made narrow properly. This enables setting the same distortion amount at the wafer central portion and the peripheral portion and, additionally, it leads to enlargement of the range in which their distribution shapes are approximately registered. Details will be explained with reference to FIGS. 27A and 27B. FIG. 27A shows a flexure curve of a wafer between the pin pitch. The axis of ordinate shows the flexure amount V. FIG. 27B shows the shape of distribution of wafer distortion between the pin pitch. The axis of ordinate shows the wafer distortion u. In FIGS. 27A and 27B, the axis of abscissa depicts the wafer position x between or inside the pin pitch, with rightward direction corresponding to the wafer outward direction. In FIG. 27A, denoted at 380 is a flexure curve at the wafer central portion. Denoted at 381 is a flexure curve at the wafer peripheral portion where the vacuum pressure is made properly lower than that at the wafer central portion and also the pin pitch is made properly narrow. Denoted at 382 is a flexure curve corresponding to a conventional example wherein, while the vacuum pressure is held constant, the pin pitch is made appropriately narrower than that at the wafer central portion. In FIG. 27B, denoted at 383, 384 and 345 are distribution shapes of wafer distortions corresponding to the flexure curve 380, the flexure curve 381 and the flexure curve 382, respectively.

It is seen from these drawings that, as regards the wafer distortion distribution shape, in the curves 382 and 385 of the conventional example, only in a narrow range a of the wafer position x, the shape is approximately registered. As compared therewith, in the curves 383 and 384 of this embodiment, in a wide range b which is about twice of the range a, the shape is approximately registered. Thus, the range for registration is widened. Although there remains a region, outside the range b, in which the shape is not registered, since at an outermost periphery of a wafer there is an invalid area of at least about 1 mm where no semiconductor device is formed, this does not cause a particular problem provided that the pin pitch is not greater than about 2 mm. Since the wafer distortions produced at the wafer central portion and the peripheral portion can have substantially the same shape, as described above, if a chuck having the same pin disposition for every shot of a wafer to be exposed is used, it can be accomplished that a distortion of substantially the same distribution shape is produced in every shot. In that occasion, an image to be printed on every shot can be corrected in accordance with the distribution shape of the wafer distortion such as by driving or rotating an imaging lens or a reticle or by correcting the reticle pattern position beforehand. As a result, the overlay precision can be improved much more, throughout a wide range including the wafer peripheral portion.

As regards the vacuum pressures at the wafer central portion and the peripheral portion, preferably they should be kept at a desired constant level without being influenced by a variation in atmospheric pressure, for example. To this end, a precision regulator, for example, may be used to supply a constant vacuum pressure, or the vacuum pressers may be detected and controlled to a constant level. Particularly, in this case, it is desirable since a good reproducibility of the wafer distortion distribution shape is assured thereby.

It is to be noted that FIGS. 27A and 27B are based on the following equations according to a material dynamics. First, the flexure curve 380 at the wafer central portion is given by:

$$v=[(P \cdot L^4)/(2 \cdot E \cdot h^3)](x^2/L^2-2x^3/L^3+x^4/L^4) \quad (2.62)$$

The flexure curves 382 and 382 at the wafer peripheral portion are given by:

$$v=[(Q \cdot R^4)/(4 \cdot E \cdot h^3)][-(R-x)/R+\{3 \cdot (R-x)^3/R^3\}-\{2 \cdot (R-x)^4/R^4\}] \quad (2.63)$$

Here, for the curve 381, Q=0.85·P and R=0.87·L. For the curve 382, Q=P and R=0.83·L.

The distribution shape 383 of the wafer distortion corresponding to the flexure curve 380 is given by:

$$u=[(P \cdot L^3)/(2 \cdot E \cdot h^2)][x/L-(3 \cdot x^2)/L^2+(2 \cdot x^3)/L^3] \quad (2.64)$$

Also, the distribution shape of the wafer distortion corresponding to the flexure curves 381 and 382 is given by:

$$u=[(Q \cdot R^3)/(8 \cdot E \cdot h^2)][-1+\{9 \cdot (R-x)^2\}/R^2-\{8 \cdot (R-x)^3\}/R^3] \quad (2.65)$$

Here, for the curve 384, Q=0.85·P and R=0.87·L. For the curve 385, Q=P and R=0.83·L.

On the other hand, due to the influence of a polishing process during the wafer production or the influence of various processes during the semiconductor manufacture, there are cases wherein the periodicity of local warps on a wafer is different between the wafer central portion and the peripheral portion. Where the periodicity at the peripheral portion is longer than that at the wafer central portion, the pin pitch at the wafer peripheral portion may be made wider than that at the wafer central portion. Also, the vacuum pressures may be set respectively and appropriately so as not produce wafer distortion. By doing so, the contact rate at the wafer peripheral portion where a dust particle can be relatively easily adhered, can be lowered.

Figure 22:
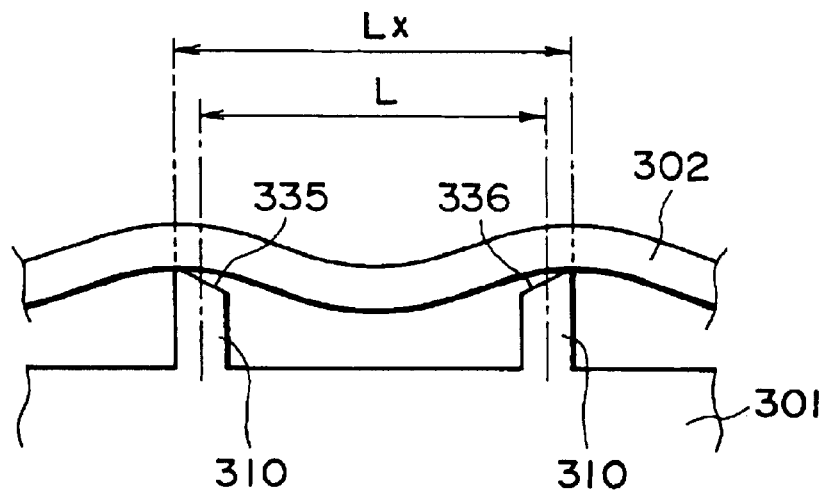
FIG. 22 is a schematic and sectional view for explaining another example of a chuck central portion.
Figure 23:
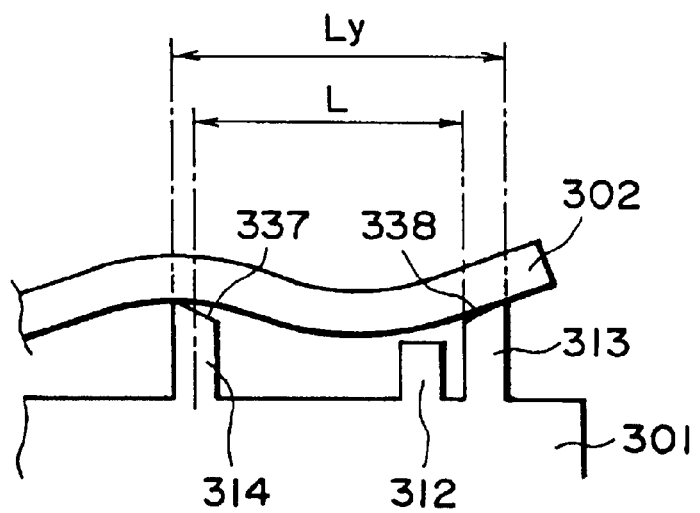
FIG. 23 is a schematic and sectional view for explaining another example of a chuck outer peripheral portion.
Figure 24:
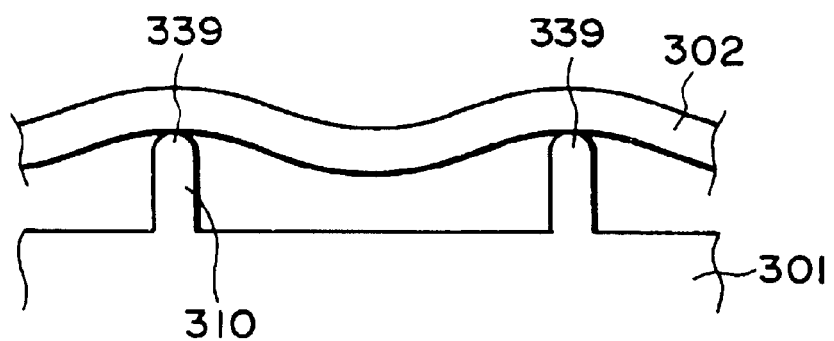
FIG. 24 is a schematic and sectional view for explaining another example of pin-like protrusions in a substrate attracting and holding system of the present invention.

Further, although the free end faces of the pin-like protrusions constituting the wafer carrying and supporting surface have been explained as a super flat surface, depending on the actual processing precision, a very small tilt may be produced there. In that occasion, therefore, the pitch of the pins which support the wafer may not be exactly the same as the pin pitch L described hereinbefore. At the wafer central portion, in a worst case, for example, as shown in FIG. 22, the free end faces of the pins 310 and 336 may be tilted in opposite directions. In that occasion, the pitch of the points contacting the wafer becomes equal to Lx which is larger than the pin pitch L by an amount corresponding to the pin diameter. Thus, in this case, the wafer flatness and the distortion will become larger than $V_1$ and $U_1$ in equations (2.10) and (2.11). On the other hand, at the wafer peripheral portion, in a worst case, for example, as shown in FIG. 23, the free end faces of the pins 313 and 314 may be tilted down toward the inside as illustrated. In that occasion, the pitch becomes equal to Ly which is larger than the pin pitch L by an amount 1.5 times the pin diameter. Therefore, in this case, the wafer flatness and the wafer distortion become larger than $V_2$ and $U_2$ in equations (2.45) and (2.46). In order that the wafer distortion satisfies its tolerance throughout the whole surface, as described above, the remainder to be provided by subtracting a value 1.5 times the pin diameter from the pin pitch L determined as described above may be taken as the actual pin pitch. However, in that case, the pin-to-wafer contact rate increases accordingly, and it is undesirable. Therefore, it is effective to process and provide a flat surface without having a tilt that may cause an adverse influence, or to reduce the pin diameter as much as possible. Also, as shown in FIG. 24, the free end face of the pin may be formed into a spherical shape. This is substantially equivalent to an example wherein the pin diameter is substantially equal to zero, and the contact rate can desirably be reduced very much. Further, the free end may be formed with a concave face without having a tilt, although the machining is not very easy.

At the wafer outer peripheral portion as shown in FIG. 19, the wafer portion projecting outwardly beyond the outermost pins 313 may protrude upwardly due to the deformation between the pins 313 and 314 at the peripheral portion. The wafer flatness and the wafer distortion in this portion will be described. The tilt angle at the peripheral portion becomes largest at the supporting position of the pin 313. This largest tilt angle α is expressed by equation (2.43) as described hereinbefore. In the range outside the supporting position of the pin 313, the largest tilt angle α is kept constantly. Therefore, the wafer distortion as determined by the largest tilt angle is held constant, without any increase. Thus, there is no problem in relation to the wafer distortion. However, if the amount of outward projection of the wafer is large, since it projects with the same largest tilt angle α, the amount of such upward protruding has to be kept smaller than the tolerance dz for the wafer flatness. Therefore, when the amount of wafer extension is J, it follows that:

$$dz \geq J \cdot \alpha \qquad (2.66)$$

Taking equation (2.43) and the correction coefficient $c_2$ with the pin disposition into account, it follows that:

$$J \leq [(4 \cdot E \cdot h^3)/(P \cdot L^3 \cdot c_2)] \cdot dz \qquad (2.67)$$

Although the right side of equation (2.67) above becomes smallest when $P \cdot L^3$ becomes largest, from equation (2.50), now it follows that:

$$P \cdot L^3 \leq (8 \cdot E \cdot h^2 \cdot dxdy)/(k \cdot c_2) \qquad (2.68)$$

Therefore, equation (2.67) can be rewritten as follows:

$$J \leq (k \cdot h \cdot dz)/(2 \cdot dxdy) \qquad (2.69)$$

Further, the right side of equation (2.69) above becomes smallest when the neutral plane correction coefficient k=1, the smallest thickness h=0.625 mm, the wafer flatness tolerance dz=80 nm, and the largest wafer distortion tolerance dxdy=5 nm. Then, $J \leq 0.005$. Namely, in order to satisfy the wafer flatness tolerance dz due to deformation inside the pin pitch, the wafer projection amount may be held to 5 mm or less. In that occasion, there occurs no problem, even in consideration of the diameter of the outermost pin 313, the outside shape tolerance of the wafer, the position precision of the same as placed on the chuck, and the width of the partition 312 when the same is provided outside the pin 313. Thus, the condition for correcting the wafer warp at the outer peripheral portion is more strict and, in this respect, the pin 313 at the outermost periphery of the chuck should desirably be disposed close to the outer periphery of the wafer as much as possible.

Although in the forgoing description the pin pitch of the chuck is explained as L and, at the wafer central portion and the peripheral portion, the chuck has a vacuum pressure P and a pin pitch L selected out of the above-described ranges, the pin pitch may of course be set separately and independently at the wafer central portion and the peripheral portion. Further, it is not necessary that a uniform pitch is defined in the wafer central portion or in the wafer peripheral portion. As long as it is within the above-described range is satisfied, a non-uniform pin pitch may be used.

The substrate to be held by the chuck is not limited to a Si wafer. For example, various substrates such as a gallium arsenic wafer, a composite adhesion wafer, a glass substrate, a liquid crystal panel substrate, and a reticle may be used. Further, as regards the outside shape thereof, it may not be circular, and it may have a rectangular shape, for example. In that occasion, the outside shape of the chuck may be changed in accordance with the outside shape of the substrate.

Further, while the chuck has been explained as a vacuum attraction type chuck, the present invention is not limited to it. The chuck may comprise an electrostatic type chuck, or it may use a combination of a vacuum attraction type and an electrostatic type. In these cases, the vacuum pressure P in the above-described embodiments may be replaced by an attraction force of a different type or a combination of it with the vacuum pressure.

Although the chuck has been described with reference to a pin chuck, the present invention is applicable also to chucks having different shapes. For example, a ring-like chuck having concentric ring-like recesses (suction grooves) and concentric ring-like protrusions for defining a wafer supporting surface, which are alternately formed, may be used. In that occasion, the pitch of the ring-like protrusions in the radial direction may be regarded as the pin pitch L. At the wafer central portion and the outer peripheral portion, a vacuum pressure P and a pin pitch L as has been described with reference to the embodiments may be set there. Substantially the same advantageous results are attainable with it.

In accordance with the present invention, degradation of the wafer flatness and distortion due to a flexure of a substrate inside the pin pitch as the same is held, can be reduced remarkably. Therefore, in the procedure for manufacture of very fine devices, the defect of device can be reduced and the yield rate can be improved significantly.

Referring now to FIG. 18, an exposure apparatus into which a substrate attracting and holding system such as described above can be incorporated, will be explained.

Figure 28:
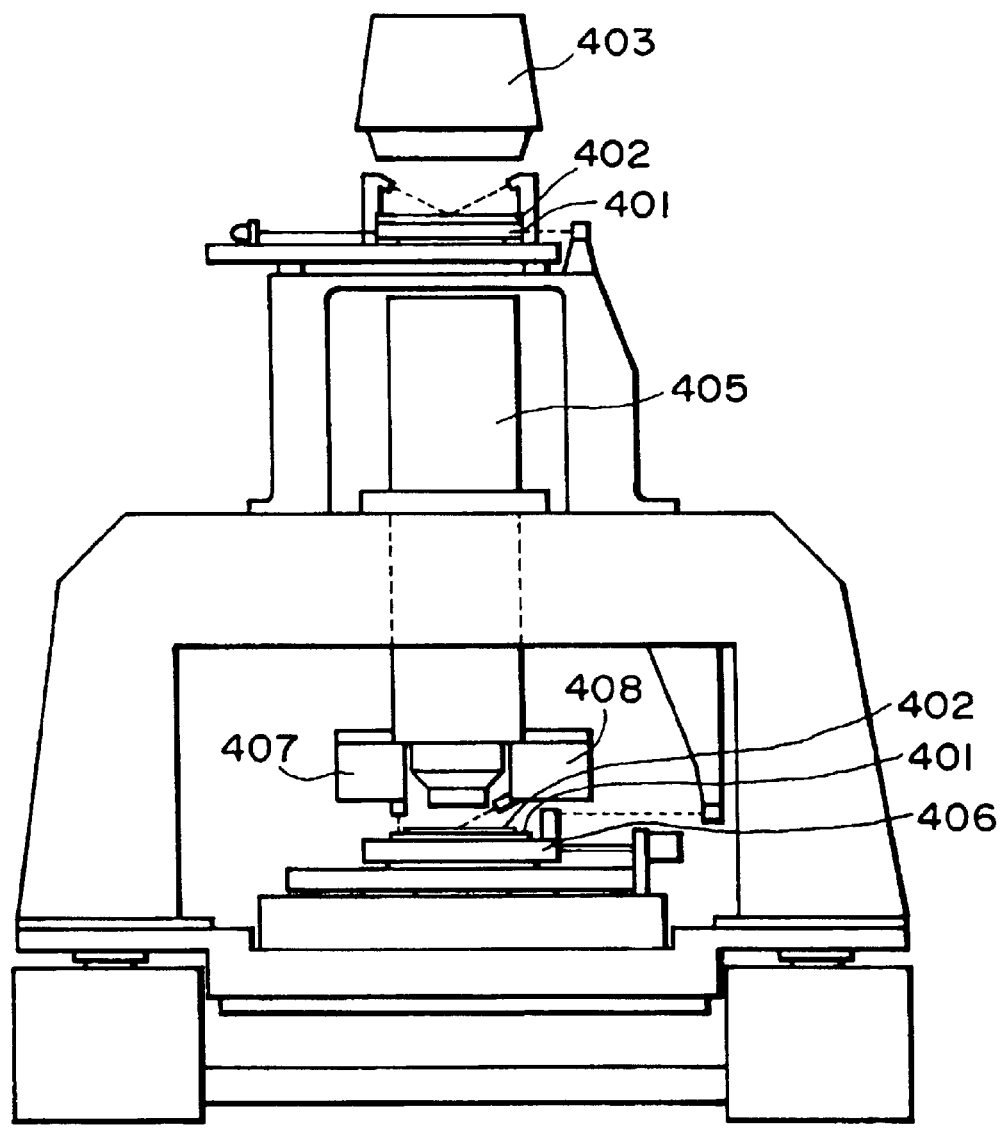
FIG. 28 is a schematic view of the structure of an exposure apparatus.

FIG. 28 is a schematic view of a general structure of a reduction projection exposure apparatus. As shown in the drawing, a reticle 402 which is an original having a pattern to be transferred to a substrate 402 such as a silicon wafer, for example, is mounted on a reticle stage 401 through a reticle chuck. The reticle is illuminated with exposure light directed thereto through an illumination optical system 403. The exposure light passing through the reticle 402 is reduced in scale by a projection optical system 405, to ⅕, and it is projected on the substrate 402 which is a workpiece to be processed. A chuck 1 which is a substrate holding system for holding the substrate 402, as described hereinbefore, is mounted on an X-Y stage 406 which is movable along a horizontal plane. The substrate 402 has a thin coating of a resist material (photosensitive material) applied thereto beforehand, which material produces a chemical reaction in response to irradiation with the exposure light. It functions as an etching mask in a subsequent process. Denoted at 407 and 408 are an off-axis alignment scope and a surface position measuring unit, respectively.

The exposure sequence is such as follows. Substrates 402 to be exposed are loaded into the exposure apparatus automatically or by hands of an operator and, in this state, in response to an exposure start signal, the operation of the exposure apparatus starts. A first substrate 402 is conveyed onto the chuck 1 mounted on the X-Y stage 406, by means of a conveying system, and the substrate is attracted and held by the chuck. Subsequently, alignment marks recorded on the substrate 401 are detected by the off-axis alignment scope 407, and on the basis of which, a magnification, a rotation and X and Y deviations are measured. Then, the position correction is performed. The X-Y stage 406 moves the substrate 402 so that a first shot position on the substrate 402 is placed at the exposure position of the exposure apparatus. After a focus correction operation made through a surface position measuring means 408, an exposure process of about 0.2 second is performed. Thereafter, the substrate is moved stepwise to its second shot position, and exposures are repeated sequentially. A similar sequence is repeated until the last shot is exposed, by which the exposure operation to one substrate is completed. The substrate is transferred from the chuck 1 to a collection conveyance hand, and then it is moved back into a substrate carrier.

The substrate attracting and holding system (chuck) of this embodiment is not limited to use in an exposure apparatus. It may of course be used in a liquid crystal substrate manufacturing apparatus, a magnetic head manufacturing apparatus, a semiconductor inspection apparatus, a liquid crystal substrate inspection apparatus, a magnetic head inspection apparatus or in the manufacture of micro-machines, for example.

Next, an embodiment of a semiconductor device manufacturing method which uses a projection exposure apparatus according to any one of the preceding embodiments, will be explained.

Figure 29:
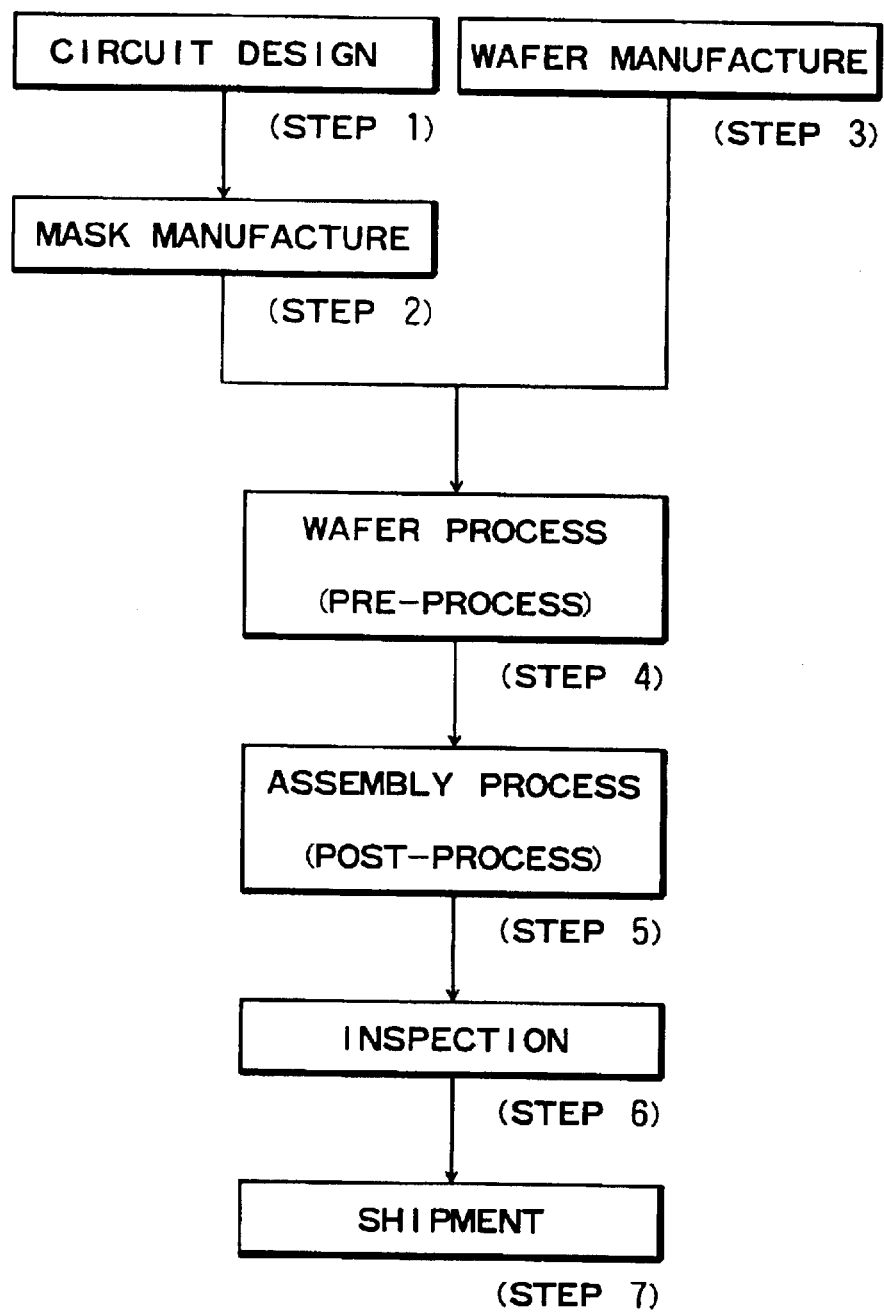
FIG. 29 is a flow chart of semiconductor device manufacturing processes.

FIG. 29 is a flow chart of procedure for manufacture of microdevices such as semiconductor chips (e.g. ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein operation check, durability check and so on for the semiconductor devices provided by step 5, are carried out. With these processes, semiconductor devices are completed and they are shipped (step 7).

Figure 30:
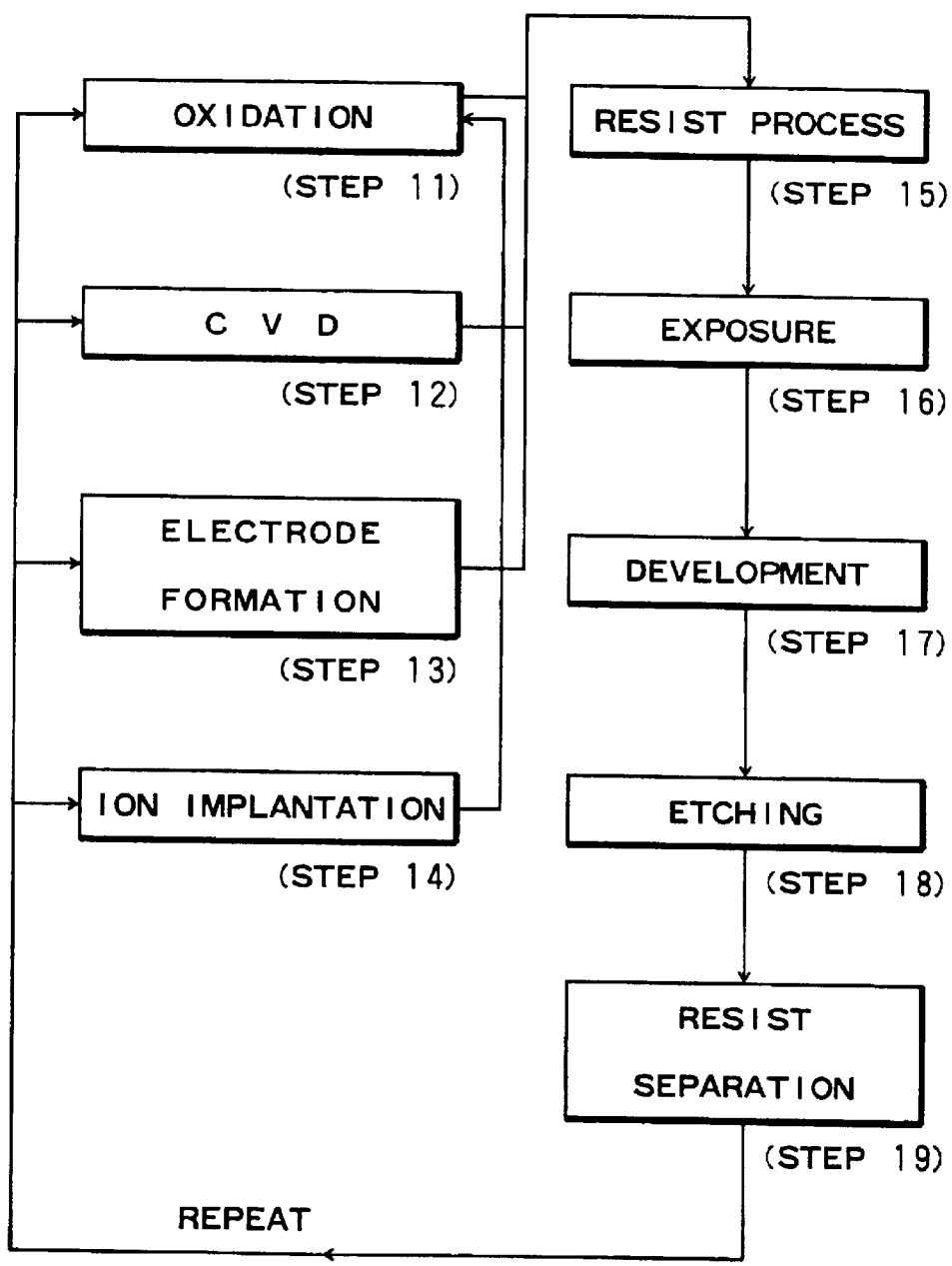
FIG. 30 is a flow chart for explaining details of a wafer process included in the procedure of FIG. 29.
Figure 31:
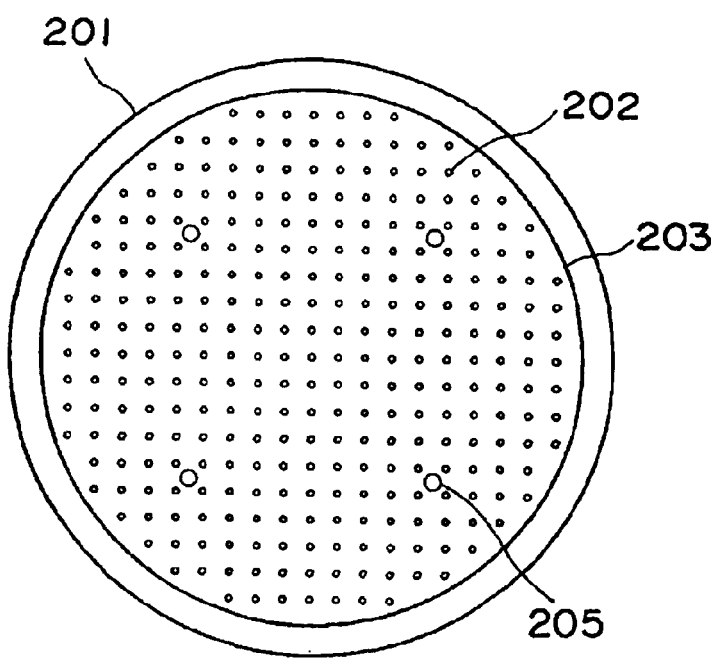
FIG. 31 is a plan view of a substrate attracting and holding system of known type.

FIG. 30 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for holding a substrate, said apparatus comprising:

a table;

protrusions, being provided on said table, on which the substrate is to be supported; and at least a portion of an attracting unit, said attracting unit attracting the substrate onto said protrusions, wherein said apparatus is arranged such that said protrusions are disposed in accordance with a pattern formed on or to be formed on the substrate.

2. An apparatus according to claim 1, wherein the pattern is one of an alignment mark, a shot region, a die region, and a scribe line formed on or to be formed on the substrate.

3. An apparatus according to claim 1, wherein an attracting force of said attracting unit is adjustable in accordance with regions on the substrate.

4. An apparatus according to claim 1, wherein said apparatus is an exposure apparatus and further comprises an exposure unit for exposing the substrate to a pattern of an original.

5. A method of manufacturing a device, said method comprising the steps of:

holding a substrate by use of an apparatus as recited in claim 1; and processing the substrate held by the apparatus.

6. An apparatus for holding a substrate, said apparatus comprising:

a chuck for supporting the substrate;

a stage for holding said chuck; and a conveyance unit for conveying said chuck onto said stage, wherein said chuck conveyed by said conveyance unit is selected on the basis of information related to protrusions, being provided on said chuck, for supporting the substrate, and information related to a pattern formed on or to be formed on the substrate.

7. An apparatus according to claim 6, wherein the pattern is one of an alignment mark, a shot region, a die region, and a scribe line formed on or to be formed on the substrate.

8. An apparatus according to claim 6, further comprising an attracting unit for attracting the substrate onto said chuck, wherein an attracting force of said attracting unit is adjustable in accordance with regions on the substrate.

9. An apparatus according to claim 6, wherein said apparatus is an exposure apparatus and further comprises an exposure unit for exposing the substrate to a pattern of an original.

10. A method of manufacturing a device, said method comprising the steps of:

holding a substrate by use of an apparatus as recited in claim 6; and processing the substrate held by the apparatus.

* * * * *

UNITED STATES PATENT AND TRADEMARK OFFICE
CERTIFICATE OF CORRECTION

PATENT NO. : 6,762,826 B2
DATED : July 13, 2004
INVENTOR(S) : Izumi Tsukamoto et al.

It is certified that error appears in the above-identified patent and that said Letters Patent is hereby corrected as shown below:

Title page,
Item [57], ABSTRACT, delete the current abstract and insert the following therefor:
-- An apparatus for holding a substrate includes a table, protrusions, being provided on the table, on which the substrate is to be supported, and at least a portion of an attracting unit, the attracting unit attracting the substrate onto the protrusions. The apparatus is arranged such that the protrusions are disposed in accordance with a pattern formed on or to be formed on the substrate. --

Column 1,
Line 15, "in" should read -- in the --.
Line 27, "made" should read -- made to --.
Line 35, "Where" should read -- When --.
Line 50, "such" should read -- such a --
Line 60, "are" should be deleted.
Line 61, "communicated" should read -- communicate --.
Line 66, "wafer" should read -- wafer, -- and "substrate" should read -- substrate, --.

Column 2,
Line 27, "marks" should read -- mark --.
Line 28, "protrusions" should read -- a protrusion --.
Line 47, "can" should read -- can- --.
Line 64, "made" should read -- made to be --.

Column 3,
Line 1, "portion" should read -- portion, --.
Lines 6 and 7, "as" should read -- is --.
Line 8, "solving" should read -- solve --.
Line 36, "where" should read -- when --.
Line 38, "pitch" should read -- pitch of --.
Line 43, "focus" should read -- focus of --.
Line 44, "precision" should read -- precision of --.

Column 4,
Line 3, "in" should read -- with --.
Line 15, "error" should read -- error, -- and "coordinate" should read -- the coordinates --.
Line 18, "substrate." should read -- substrate, is reduced. --.
Line 22, "provided on said holding table, said protrusion" should be deleted.
Line 33, the second occurrence of "a" should be deleted.

UNITED STATES PATENT AND TRADEMARK OFFICE
CERTIFICATE OF CORRECTION

PATENT NO. : 6,762,826 B2
DATED : July 13, 2004
INVENTOR(S) : Izumi Tsukamoto et al.

It is certified that error appears in the above-identified patent and that said Letters Patent is hereby corrected as shown below:

Column 5,
Line 64, the first occurrence of "curves" should be deleted and "double-ends" should read -- double-end --.

Column 7,
Line 1, "100" should read -- 100, --.
Line 9, "1C)" should read -- 1C), --.
Lines 10 and 12, "to" should read -- to the --.
Line 11, "13" should read -- 13, --.
Lines 16 and 18, "2" should be deleted.
Line 33, "and" should read -- and a --.

Column 8,
Line 2, "coordinate" should read -- coordinates --.
Line 24, "marks" should read -- mark --.
Line 25, "kept" should read -- maintained --.
Line 29, the first occurrence of "the" should be deleted.
Lines 46, 53 and 64, "to" should read -- to the --.
Lines 50 and 57, both occurrences of "in" should read -- in the --.
Lines 59, 60 and 63, "in" should read -- in the --.

Column 9,
Line 54, "is" should read -- are --.

Column 10,
Line 12, "advantageously" should read -- advantageously, --.
Line 30, "as" should read -- as those --.

Column 11,
Line 17, "such" should read -- such a --.
Line 18, "is" should read -- are --.
Line 34, "such" should read -- such a --.
Line 45, "relatively" should read -- relative --.
Line 61, "In" should read -- On --.

Column 12,
Line 50, "such" should read -- such a --.

UNITED STATES PATENT AND TRADEMARK OFFICE
CERTIFICATE OF CORRECTION

PATENT NO. : 6,762,826 B2
DATED : July 13, 2004
INVENTOR(S) : Izumi Tsukamoto et al.

It is certified that error appears in the above-identified patent and that said Letters Patent is hereby corrected as shown below:

Column 13,
Line 26, "such" should read -- such a --;
Line 48, "can not" should read -- cannot --.

Column 14,
Line 5, ""reticle")" should read -- "reticle"), --.
Line 24, "material" should read -- material, --.
Line 35, "can not" should read -- cannot --.
Line 42, "in" should read -- with --.
Lines 53 and 60, "even" should read -- evenly --.
Line 56, "Where" should read -- When --.
Line 61, "to" should read -- to the --.

Column 15,
Line 17, "in" should read -- in the -- and "x" should be deleted.
Line 18, "location" should read -- location, --.
Line 19, "in" should read -- in the --.

Column 16,
Line 35, "an" should read -- a --.

Column 17,
Line 5, "60-deg." should read -- 60-degree --.
Line 7, "on" should read -- on a --.
Line 47, "even" should read -- evenly --.
Line 57, "Where" should read -- When --.

Column 18,
Line 5, "where" should read -- when --.
Line 6, "follow" should read -- follows --.
Line 15, "Where" should read -- When --.
Line 25, "Since" should read -- Since, -- and "practice" should read -- practice, --.
Lines 31, 32 and 36, "in" should read -- in the --.
Line 51, the second occurrence of "surface," should read -- surface, or --.

Column 19,
Line 3, "relatively" should read -- relative --.
Line 7, "in" should read -- with --.
Line 9, "practically" should read -- practically, --.

UNITED STATES PATENT AND TRADEMARK OFFICE
CERTIFICATE OF CORRECTION

PATENT NO. : 6,762,826 B2
DATED : July 13, 2004
INVENTOR(S) : Izumi Tsukamoto et al.

It is certified that error appears in the above-identified patent and that said Letters Patent is hereby corrected as shown below:

Column 9 (cont'd),
Lines 12, 40, 56 and 60, "60-deg." should read -- 60-degree --.
Line 15, "where" should read -- when --.
Line 29, "of" should read -- in --.
Line 33, "$(=2^{1/}$" should read -- $(=2^{1/2})^4)$ --.
Line 34, "$_2)^4)$" should be deleted.
Line 35, "Since" should read -- Since, -- and "however" should read -- however, --.
Line 63, "poi" should read -- point --.

Column 20,
Line 41, "of" should read -- having -- and "diameter" should read -- diameter of --.

Column 21,
Line 19, "can not" should read -- cannot --.
Line 30, "of" should read -- having -- and "diameter" should read -- diameter of --.
Line 32, "in" should read -- on --.
Line 40, "in" should read -- in the --.
Line 41, "be come" should read -- become --.
Line 54, "strict" should read -- stricter --.

Column 22,
Line 19, "h=0.725" should read -- h=0.625 --.
Line 35, the second occurrence of "in" should read -- with --.

Column 23,
Lines 27 and 39, "60-deg." should read -- 60-degree --.
Line 30, "$n(\frac{2}{3}\ ^{1/2})/L^2$" should read -- $n=(2/3^{1/2})/L^2$ --.
Line 32, "where" should read -- when --.
Line 63, "with" should be deleted.
Line 64, "it" should be deleted; "is" should read -- is, -- and "principle" should read -- principle, --.

Column 24,
Line 9, "in" should read -- in the --.
Line 31, "thereof," should read -- thereof, a --.
Line 32, "on" should read -- of --.
Line 34, "potion" should read -- portion --.
Line 49, "a even" should read -- an evenly --.
Line 55, "Where" should read -- When --.

UNITED STATES PATENT AND TRADEMARK OFFICE
CERTIFICATE OF CORRECTION

PATENT NO. : 6,762,826 B2
DATED : July 13, 2004
INVENTOR(S) : Izumi Tsukamoto et al.

It is certified that error appears in the above-identified patent and that said Letters Patent is hereby corrected as shown below:

Column 25,
Line 7, "give" should read -- given --.
Line 10, "where" should read -- when --.
Line 32, "$P \leqq [(15.38 \cdot E \cdot h^3 \cdot dz)/c_1] \cdot (1/L^4)$" should read -- $P \leq [(15.38 \cdot E \cdot h^3 \cdot dz)/c_1] \cdot (1/L^4)$ --.
Line 59, "tolerance dz is 80 nm and the wafer distortion" should be deleted.
Line 61, the first occurrence of "is" should read -- as --.
Line 67, "L" should read -- L, --.

Column 26,
Line 62, "in" should read -- with --.

Column 27,
Line 39, "in" should read -- with --.
Line 50, "Where" should read -- When --.

Column 28,
Line 1, "Where" should read -- When --.
Line 9, "In" should read -- On --.
Lines 14, 15, 16 and 21, "pin" should read -- pins --.
Line 48, "may" should read -- may be --.
Line 49, "made narrow properly." should read -- made properly narrow. --
Line 57, "V." should read -- v. --.
Line 61, "with" should read -- with the --.

Column 29,
Line 5, "345" should read -- 385 --.
Line 27, "In" should read -- On --.
Line 30, "imaging" should read -- image -- and the second occurrence of "or" should be deleted.
Line 39, "pressers" should read -- pressure --.
Line 45, "a" should be deleted.
Line 49, the first occurrencee of "382" should read -- 381 --.

Column 30,
Line 4, "Where" should read -- When --.
Line 7, "not" should read -- not to --.
Lines 15 and 30, "In" should read -- On --.
Line 21, the second occurrence of "In" should read -- On --.
Line 22, "Lx" should read -- Lx, --.

UNITED STATES PATENT AND TRADEMARK OFFICE
CERTIFICATE OF CORRECTION

PATENT NO. : 6,762,826 B2
DATED : July 13, 2004
INVENTOR(S) : Izumi Tsukamoto et al.

It is certified that error appears in the above-identified patent and that said Letters Patent is hereby corrected as shown below:

Column 31,
Line 28, the first occurrence of "In" should read -- On --.
Line 39, "forgoing" should read -- foregoing --.
Line 45, the second occurrence of "is" should read -- be --.
Line 47, the first occurrence of "is" should read -- is set to be -- and "is satisfied," should be deleted.
Line 55, "In" should read -- On --.

Column 32,
Line 5, "In" should read -- On --.
Line 7, "has" should read -- have --.
Line 14, "for" should read -- for the --.
Line 15, "defect" should read -- defects -- and "device" should read -- devices --.
Line 23, "402" should read -- 402, --.

Column 33,
Line 3, "may" should read -- may, -- and "of course" should read -- of course, --.
Line 13, the first occurrence of "of" should read -- of a -- and "for" should read -- for the --.
Line 14, "e.g." should read -- e.g., --.
Line 28, "wherein" should read -- wherein an --.
Line 29, "check," should read -- check, a --.

Signed and Sealed this

Fifth Day of April, 2005

JON W. DUDAS
*Director of the United States Patent and Trademark Office*